(12) United States Patent
Prager et al.

(10) Patent No.: US 12,665,548 B2
(45) Date of Patent: Jun. 23, 2026

(54) EFFICIENT HIGH POWER MICROWAVE GENERATION USING RECIRCULATING PULSES

(71) Applicant: EHT Ventures LLC, Seattle, WA (US)

(72) Inventors: James R. Prager, Seattle, WA (US); Timothy M. Ziemba, Bainbridge Island, WA (US); Kenneth E. Miller, Seattle, WA (US)

(73) Assignee: EHT Ventures LLC, Seattle, WA (US)

(*) Notice: Subject to any disclaimer, the term of this patent is extended or adjusted under 35 U.S.C. 154(b) by 243 days.

(21) Appl. No.: 18/470,415

(22) Filed: Sep. 19, 2023

(65) Prior Publication Data

US 2024/0007052 A1     Jan. 4, 2024

Related U.S. Application Data

(63) Continuation of application No. 16/856,219, filed on Apr. 23, 2020, now Pat. No. 11,777,448, which is a continuation of application No. 15/590,091, filed on May 9, 2017, now Pat. No. 10,666,198.

(51) Int. Cl.
*H03B 9/14* (2006.01)
*H03K 27/00* (2006.01)

(52) U.S. Cl.
CPC ............. *H03B 9/143* (2013.01); *H03K 27/00* (2013.01)

(58) Field of Classification Search
CPC .......... H03B 9/00; H03B 9/143; H03K 27/00; H03K 3/00; H03K 3/45; H03K 3/53; H03K 3/537; H03K 3/55; H03K 3/57; H03K 5/06; H03K 5/01; H03K 5/04; H03K 5/14; H03K 5/13
See application file for complete search history.

(56) References Cited

U.S. PATENT DOCUMENTS

| | | | | |
|---|---|---|---|---|
| 5,023,574 A | * | 6/1991 | Anklam | ................... H03K 5/12 327/493 |
| 6,690,247 B2 | | 2/2004 | Kintis et al. | |
| 7,106,817 B2 | * | 9/2006 | Matsugatani | ....... H04L 27/2647 375/354 |

(Continued)

OTHER PUBLICATIONS

Restriction Requirement in U.S. Appl. No. 15/590,091 dated Mar. 8, 2019, 8 pages.

(Continued)

*Primary Examiner* — Diana J. Cheng

(57)     ABSTRACT

A high frequency electromagnetic radiation generation device is disclosed that includes a high voltage input, a nonlinear transmission line, an antenna, and a pulse recirculating circuit. In some embodiments, the high voltage input may be configured to receive electrical pulses having a first peak voltage that is greater than 5 kV, and/or may be electrically coupled with the nonlinear transmission line. The antenna may be electrically coupled with the nonlinear transmission line and/or may radiate electromagnetic radiation at a frequency greater than 100 MHz about a voltage greater than 5 kV. The pulse recirculating may be electrically coupled with the high voltage input and the antenna. The pulse recirculating circuit may include a diode; a low pass filter; and a delay line. In some embodiments, unradiated energy from the antenna is directed through the pulse recirculating circuit to the nonlinear transmission line with a delay of less than 100 ns.

17 Claims, 18 Drawing Sheets

(56) References Cited

U.S. PATENT DOCUMENTS

| | | | | |
|---|---|---|---|---|
| 7,193,486 | B2 | 3/2007 | Mrozek et al. | |
| 7,339,440 | B2 * | 3/2008 | Ricketts | H03B 5/1852 |
| | | | | 331/106 |
| 8,744,004 | B2 * | 6/2014 | London | H03K 5/12 |
| | | | | 375/299 |
| 8,922,973 | B1 | 12/2014 | Elizondo-Decanini | |
| 9,026,073 | B2 * | 5/2015 | He | H01Q 1/243 |
| | | | | 455/193.1 |
| 10,666,198 | B2 | 5/2020 | Prager et al. | |
| 11,777,448 | B2 * | 10/2023 | Prager | H03B 9/143 |
| | | | | 307/106 |
| 2006/0114550 | A1 | 6/2006 | Ricketts et al. | |
| 2008/0203825 | A1 | 8/2008 | Nakasha | |
| 2008/0254759 | A1 | 10/2008 | Kintis et al. | |
| 2011/0235742 | A1 | 9/2011 | London et al. | |
| 2012/0082199 | A1 | 4/2012 | Blech | |
| 2015/0130525 | A1 | 5/2015 | Miller et al. | |
| 2015/0318846 | A1 | 11/2015 | Prager et al. | |

OTHER PUBLICATIONS

Non-Final Office Action in U.S. Appl. No. 15/590,091 dated Aug. 1, 2019, 9 pages.

Notice of Allowance in U.S. Appl. No. 15/590,091 dated Feb. 6, 2020, 9 pages.

Non-Final Office Action in U.S. Appl. No. 16/856,219 dated Jun. 15, 2021, 16 pages.

Final Office Action in U.S. Appl. No. 16/856,219 dated Dec. 7, 2021, 22 pages.

Advisory Action in U.S. Appl. No. 16/856,219 dated Jun. 7, 2022, 5 pages.

Non-Final Office Action in U.S. Appl. No. 16/856,219 dated Sep. 20, 2022, 7 pages.

Final Office Action in U.S. Appl. No. 16/856,219 dated Mar. 22, 2023, 5 pages.

Notice of Allowance in U.S. Appl. No. 16/856,219 dated Jun. 26, 2023, 9 pages.

* cited by examiner

*FG. 8*

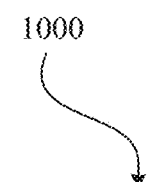
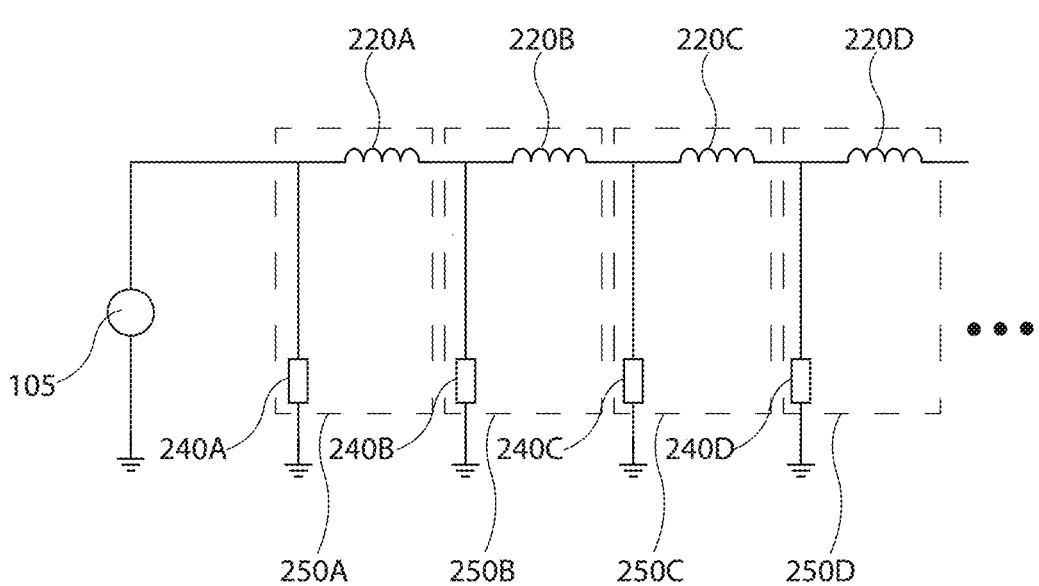
*FIG. 10*

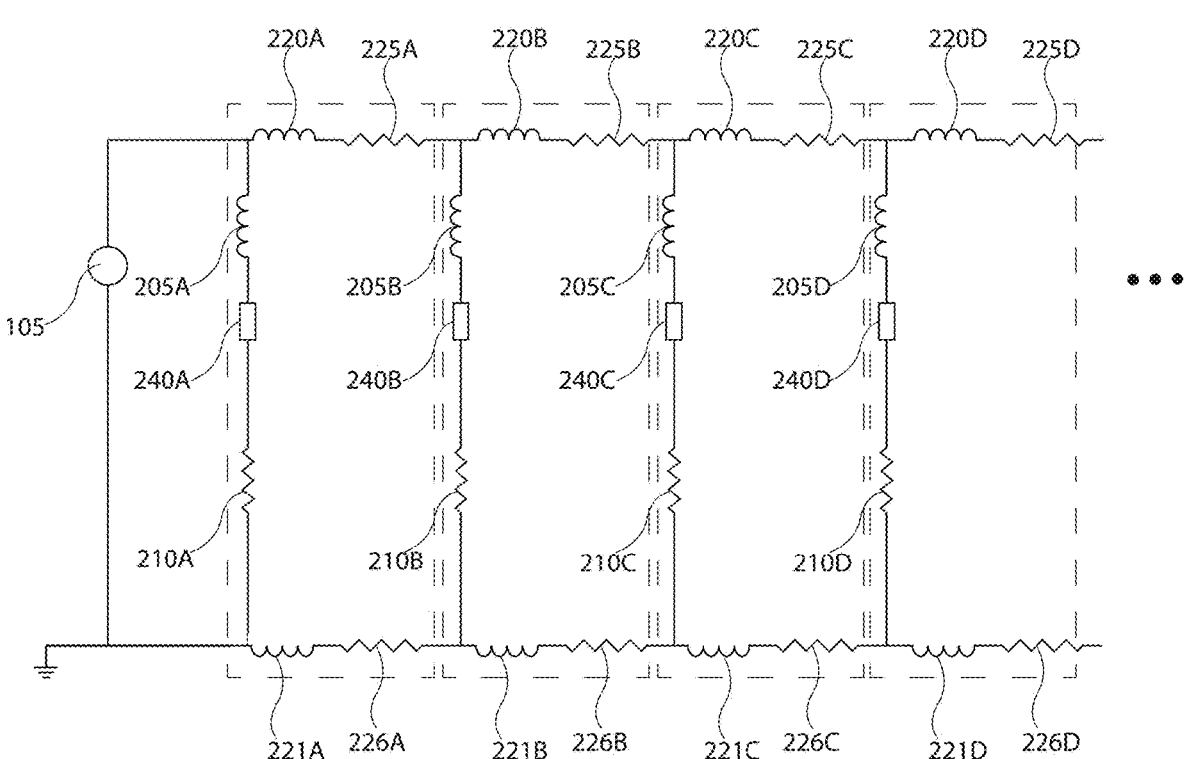
*FIG. 12*

EFFICIENT HIGH POWER MICROWAVE GENERATION USING RECIRCULATING PULSES

BACKGROUND

Producing high power microwave pulses efficiently is challenging due to the high voltages and high frequencies involved.

SUMMARY

A high frequency electromagnetic radiation generation device is disclosed that includes a high voltage input, a nonlinear transmission line, an antenna, and a pulse recirculating circuit. In some embodiments, the high voltage input may be configured to receive electrical pulses having a first peak voltage that is greater than 5 kV. In some embodiments, the nonlinear transmission line may be electrically coupled with the high voltage input. In some embodiments, the antenna may be electrically coupled with the nonlinear transmission line and/or may radiate electromagnetic radiation at a frequency greater than 100 MHz about a voltage greater than 5 kV. The pulse recirculating may be circuit electrically coupled with the high voltage input and the antenna. In some embodiments, the pulse recirculating circuit may include a diode; a low pass filter; and a delay line. In some embodiments, unradiated energy from the antenna is directed through the pulse recirculating circuit to the nonlinear transmission line with a delay of less than 100 ns.

In some embodiments, the nonlinear transmission line may include a plurality of circuit elements that include a nonlinear semiconductor junction capacitance device and an inductor.

In some embodiments, the high voltage input is coupled with a nanosecond pulser.

In some embodiments, the antenna has an impedance less than about 300 Ohms.

A high frequency electromagnetic radiation generation device is disclosed that includes a high voltage input configured to receive electrical pulses having a first peak voltage that is greater than 5 kV; a nonlinear transmission line electrically coupled with the high voltage input; a high voltage output electrically coupled with the nonlinear transmission line that radiates electromagnetic radiation at a frequency greater than 100 MHz about a voltage greater than 5 kV; and a pulse recirculating circuit electrically coupled with the high voltage input and the high voltage output, the pulse recirculating circuit may be configured to direct unradiated energy to the nonlinear transmission line.

In some embodiments, the pulse recirculating circuit comprises a low pass filter.

In some embodiments, the pulse recirculating circuit comprises at least one diode.

In some embodiments, the pulse recirculating circuit comprises a transmission line.

In some embodiments, the transmission line comprises a delay line that introduces a delay of less than 500 ns in a pulse traveling through the pulse recirculating circuit.

In some embodiments, the nonlinear transmission line comprises a plurality of circuit elements electrically coupled with ground, each of the plurality of circuit elements includes a nonlinear semiconductor junction capacitance device and an inductor, wherein each of the plurality of circuit elements is electrically coupled with at least one corresponding one of the plurality of circuit elements.

In some embodiments, the high voltage input is coupled with a nanosecond pulser.

A method is also disclosed. The method may include pulsing a high voltage pulser to produce a first pulse that has a voltage greater than 5 kV and a pulse width less than 100 ns; radiating a first plurality of electromagnetic radiation pulses from the first pulse at a frequency greater than 100 MHz and; pulsing the high voltage pulser to produce a second pulse that has a voltage greater than 5 kV and a pulse width less than 100 ns; and radiating a second plurality of electromagnetic radiation pulses from the second pulse at a frequency greater than 100 MHz. The method may repeatedly recirculate pulses and reradiate additional electromagnetic radiation pulses from the recirculated pulses.

In some embodiments, the method may also include recirculating at least a portion of the first pulse through one or more circuit elements to produce each of the first plurality of electromagnetic radiation pulses. In some embodiments, the method may also include recirculating at least a portion of the second pulse through one or more circuit elements to produce each of the second plurality of electromagnetic radiation pulses.

In some embodiments, the one or more circuit elements comprises a circuit element selected from the list consisting of a diode, a filter, a delay line, and a nonlinear transmission line. In some embodiments, the first plurality of electromagnetic radiation pulses may be radiated from an antenna.

In some embodiments, the first plurality of electromagnetic radiation pulses radiates about a voltage greater than 5 kV; and wherein the second plurality of electromagnetic radiation pulses radiate about a voltage greater than 5 kV.

Another method is disclosed. The method may include pulsing a high voltage pulser to produce a first initial pulse that has a voltage greater than 5 kV, a pulse width less than 100 ns, and with a first energy; radiating a first electromagnetic radiation pulse from a portion of the first initial pulse at a frequency greater than 100 MHz; recirculating a portion of the first initial pulse; pulsing a high voltage pulser to produce a second initial pulse that has a voltage greater than 5 kV, a pulse width less than 100 ns, and with a second energy, the second energy less than the first energy; combining the second initial pulse with the recirculated portion of the first initial pulse to create a combined second pulse; and radiating a second electromagnetic radiation pulse from a portion of the combined second pulse at a frequency greater than 100 MHz.

In some embodiments, the method may also include recirculating a portion of the combined second pulse; pulsing a high voltage pulser to produce a third initial pulse that has a voltage greater than 5 kV, a pulse width less than 100 ns, and with a third energy, the third energy less than the first energy; combining the third initial pulse with the recirculated portion of the combined second pulse to create a combined third pulse; and radiating a third electromagnetic radiation pulse from a portion of the combined third pulse at a frequency greater than 100 MHz.

In some embodiments, the first initial pulse may be propagated through a nonlinear transmission line, the second initial pulse may be propagated through the nonlinear transmission line, and/or the recirculated portion of the first pulse may be propagated through the nonlinear transmission line. In some embodiments, the portion of the first initial pulse may be recirculated through a transmission line that introduces a delay in the portion of the first initial pulse.

BRIEF DESCRIPTION OF THE FIGURES

These and other features, aspects, and advantages of the present disclosure are better understood when the following Detailed Description is read with reference to the accompanying drawings.

FIG. 10 is a circuit diagram of a nonlinear transmission line according to some embodiments.

FIG. 12 is a circuit diagram of a nonlinear transmission line according to some embodiments.

DETAILED DESCRIPTION

A high frequency electromagnetic generation device is disclosed. In some embodiments, the high frequency electromagnetic generation device may include a pulse recirculating circuit.

Typical electromagnetic generation system efficiencies can be quite low. For example, these efficiencies can range from a few percent to approximately 60% for the best klystron systems. High efficiency klystrons that can generate high peak power more than several hundred kilowatts can be costly and/or require large facility demands which can make them unsuitable for most applications. The total output efficiency of a nonlinear transmission line can be quite high (e.g., ~80%). Not all this energy, however, is directly converted to RF. Typically, the nonlinear transmission line may only convert 1-10% of the initial pulse energy to the frequency of interest. The remaining energy in the pulse, which is broadband in nature, is typically lost in the circuit termination resistance. In some embodiments, the energy loss can result in 100 to 1000 Joules of potential heating.

A pulse recirculating circuit can be used to increase the energy efficiency of an electromagnetic generation system. In some embodiments, the pulse recirculating circuit may include, for example, a filter, a diode, and/or delay line. The pulse recirculating circuit, for example, can be electrically coupled with the load and/or the input of the nonlinear transmission line.

For example, a pulser may provide a pulse having a voltage greater than 5 kV (alternatively greater than 10 kV, 20 kV, 50 kV, etc.), a pulse width of less than about 100 ns, 50 ns, 25 ns, 10 ns, 5 ns, etc. In some embodiments, a nonlinear transmission line can be used to shorten the rise time and/or fall time of the pulse, for example, to less than 50 ns, 40 ns, 30 ns, 20 ns, 10 ns, etc. Alternatively or additionally, a nonlinear transmission line may generate an electromagnetic pulse. (e.g., 100 MHz-30 GHz). A pulse recirculating circuit can be used to recirculate pulses (or portions of a pulse) through the nonlinear transmission line to radiate another electromagnetic pulse with a given delay.

In some embodiments, a pulse recirculating circuit may be used in conjunction with a pulser (e.g., a pulser with a nonlinear transmission line) to radiate a plurality of high frequency electromagnetic pulses with a frequency of about 100 MHz-30 GHz from a single high voltage pulse from the pulser. In some embodiments, the pulser may generate a plurality of high voltage pulses, which may result in a factor of N high frequency electromagnetic pulses to be radiated.

Figure 1:
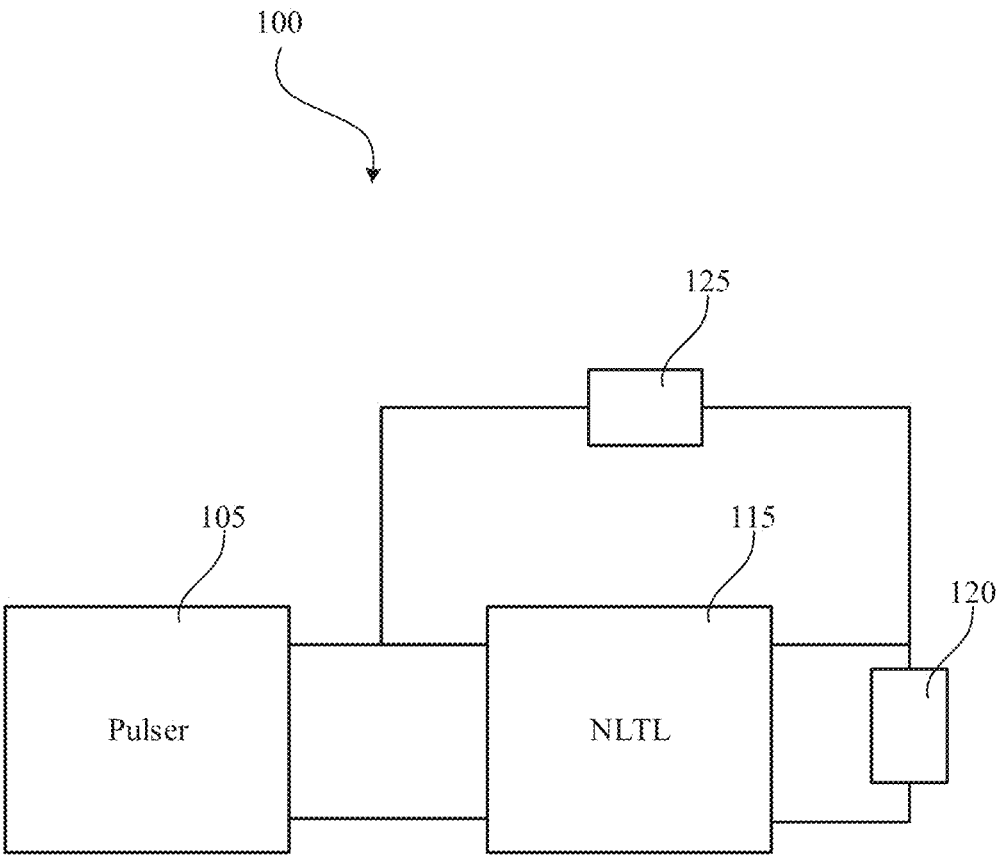
FIG. 1 is a block diagram of a nonlinear transmission line microwave generation device having a pulse recirculating circuit according to some embodiments.

FIG. 1 is a block diagram of a high frequency electromagnetic radiation generation device 100 having a pulse recirculating circuit 125 according to some embodiments. The nonlinear transmission line 115 can include any nonlinear transmission line. The nonlinear transmission line, for example, may include a nonlinear transmission line described in accordance with some embodiments of the invention. The nonlinear transmission line, for example, may include a ferromagnetic nonlinear transmission line, gyromagnetic nonlinear transmission line, an LC ladder nonlinear transmission line, a lumped element nonlinear transmission line, a dielectric and/or capacitive lumped element nonlinear transmission line, a parallel plate segmented nonlinear transmission line, a magnetic lumped element nonlinear transmission line, etc.

The nonlinear transmission line 115, for example, may sharpen the rise time of one or more high voltage pulses (e.g., decrease the rise time, speed up the rise time, etc.) produced by the high voltage pulser 105 to the point where the output rings. The nonlinear transmission line 115 may include the nonlinear transmission line 1000, 1100, 1200, or some variation thereof.

In some embodiments, for example, a floating output of the high voltage pulser 105 can be electrically coupled with the nonlinear transmission line 115. And the nonlinear transmission line 115 may be coupled with an output that may include the load 120.

In some embodiments, the high frequency electromagnetic radiation generation device 100 may or may not include load 120. The load 120, for example, may be coupled with the output of the nonlinear transmission line 115. In some embodiments, the load 120 may be an antenna that outputs an electromagnetic pulse that oscillates with a frequency of 100 MHz-30 GHz. In some embodiments, the antenna may output an electromagnetic pulse that oscillates around any voltage such as, for example, 0 volts, 1 kV, 5 kV, 10 kV, 20 kV, etc.

In some embodiments, the high frequency electromagnetic radiation generation device 100 may produce electromagnetic radiation in the following frequency bands:

VHF: 0.03 to 0.3 GHz (Very High Frequency)
UHF: 0.3 to 1 GHz (Ultra-High Frequency)
L: 1 to 2 GHz
S: 2 to 4 GHz
C: 4 to 8 GHz
X: 8 to 12 GHz In some embodiments, the load 120 may propagate a high voltage, electromagnetic microwave signal. In some embodiments, the load 120 may have an impedance less than about 500, 250, 100, 75, 50, 25, etc. Ohms. In some embodiments, the antenna may have an impedance that is matched with NLTL 115.

The load 120 can include an antenna that radiates electromagnetic pulses and/or may have a low impedance. For example, the impedance of load 120 can be less than about 500 Ohms, 250 Ohms, 100 Ohms, 50 Ohms, 25 Ohms, etc. In some embodiments, the pulse recirculating circuit 125 may introduce a given delay as the pulse passes through the pulse recirculating circuit 125. The given delay may be of 500 ns, 250 ns, 100 ns, 50 ns, 25 ns, 10 ns, 5 ns, etc.

The high voltage pulser 105 may include, for example, a plurality of solid state switches (e.g., IGBT, MOSFET, FETs, SiC, GAN switches) and/or a transformer. The high voltage pulser 105 may, for example, be designed and/or constructed with low stray inductance and/or low stray capacitance. The high voltage pulser 105 may, for example, may produce high voltage pulses having a fast rise time, a high voltage (e.g., greater than 1 kV), a variable pulse width, a high repetition rate, etc. Any type of high voltage pulser may be used. The high voltage pulser 105 may include the high voltage nanosecond pulser described in U.S. Patent Publication 2015/0130525 and/or U.S. Patent Publication 2015/0318846 the entirety of each of which are incorporated by reference for disclosing a pulser 105.

In some embodiments, the high voltage pulser 105 may, for example, operate with variable pulse widths, voltages greater than 1 kV (or even up to 100 kV), and/or a pulse repetition frequency of 10 kHz-100 kHz.

In some embodiments, the high voltage pulser 105 may operate in a single pulse regime, or in a regime with long pulses.

In some embodiments, the pulse recirculating circuit 125 can be electrically coupled with the load 120 and the input of the nonlinear transmission line 115. The pulse recirculating circuit 125 can recirculate pulses from the load 120 to the input of the nonlinear transmission line 115 with a given delay.

In some embodiments, the pulse recirculating circuit 125 can be electrically coupled with the load 120 and the output of the nonlinear transmission line 115. The pulse recirculating circuit 125 can recirculate pulses from the load 120 to the output of the nonlinear transmission line 115 with a given delay.

In some embodiments, the pulse recirculating circuit 125 can be electrically coupled with the load 120 and the input of the load 120. The pulse recirculating circuit 125 can recirculate pulses from the load 120 to the input of the load 120 with a given delay.

In some embodiments, the pulse recirculating circuit 125 can be electrically coupled with a portion of the of the nonlinear transmission line. For example, a nonlinear transmission line may have a first plurality of lumped elements arranged in series with a second plurality of lumped elements. The pulse recirculation circuit 125 may be coupled at with the nonlinear transmission line at position between the first plurality of the lumped elements and the second plurality of lumped elements. As another example, the pulse recirculating circuit may be electrically coupled with a portion of a gyromagnetic nonlinear transmission line.

In some embodiments, the pulser 105 may inject a high voltage pulse with a given amount of energy into the nonlinear transmission line 115. Some energy from this high voltage pulse may be dissipated by the nonlinear transmission line 115. When the pulse reaches the antenna (e.g., load 120), some of this energy may be radiated away as electromagnetic radiation. The energy from the pulse that was not radiated, can enter the pulse recirculating circuit 125. Some of the pulse energy may be dissipated by losses in the recirculating circuit 125. In some embodiments, the recirculated pulse can reenter the nonlinear transmission line 115, where some energy may be dissipated due to losses. Energy in the recirculated pulse can be radiated from the antenna, and the remaining energy may enter the recirculating circuit. This may be repeated until there is no more energy in that pulse and/or the voltage is too small to be useful.

For example, if a high voltage pulse from the pulser is 20 kV and is 100 ns wide, and the nonlinear transmission line 115 and/or the antenna are 50 Ohms, the pulse energy can be calculated as follows:

$$E = \frac{V^2}{Z} \Delta t = \frac{(20 \text{ kV})^2}{50 \text{ } \Omega}(100 \text{ ns}) = 800 \text{ mJ}$$

Assuming, for example, the nonlinear transmission line 115 is 96% efficient, the antenna radiates 10% of the pulse energy, and the recirculating circuit 125 is 98% efficient. The following table shows the energy in millijoules (mJ) when the pulse is at different locations in the circuit for a single pulse.

| Pass Number | NLTL Input | NLTL Output | Energy Radiated by Antenna | Energy into Recirculating Circuit | Energy out of Recirculating circuit |
|---|---|---|---|---|---|
| 1 | 800.0 | 768.0 | 76.8 | 691.2 | 677.4 |
| 2 | 677.4 | 650.3 | 65.0 | 585.3 | 573.5 |
| 3 | 573.5 | 550.6 | 55.1 | 495.5 | 485.6 |
| 4 | 485.6 | 466.2 | 46.6 | 419.6 | 411.2 |
| 5 | 411.2 | 394.7 | 39.5 | 355.3 | 348.2 |
| 6 | 348.2 | 334.2 | 33.4 | 300.8 | 294.8 |
| 7 | 294.8 | 283.0 | 28.3 | 254.7 | 249.6 |
| 8 | 249.6 | 239.6 | 24.0 | 215.7 | 211.4 |

In some embodiments, when the pulse reaches the end of the recirculating circuit 125 and/or the nonlinear transmission line 115 input, a second pulse may be produced by the pulser 105, which combines with the recirculating pulse. The pulser 105 may add additional energy to the recirculating pulse. This process may be repeated so that the pulse never decays significantly.

In some embodiments, the pulser may add energy at alternate recirculating pulses such as, for example, the $2^{nd}$, $3^{rd}$ . . . or $n^{th}$ pass through the recirculating circuit.

Figure 2:
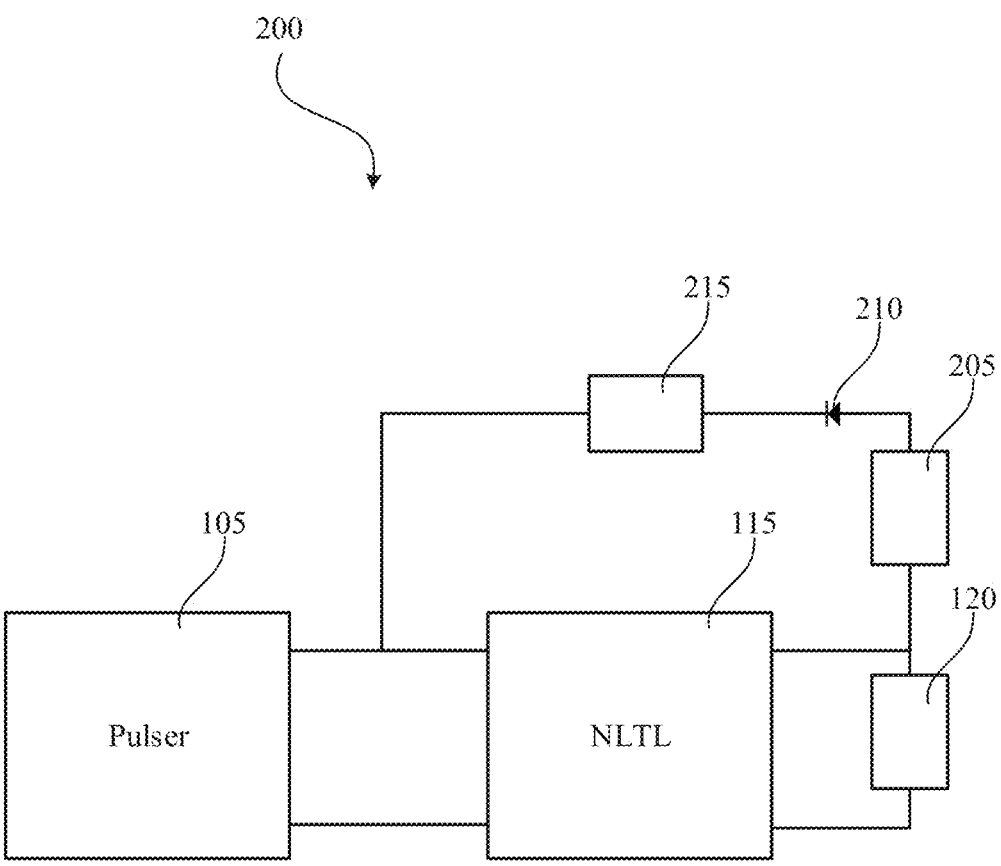
FIG. 2 is a block diagram of a nonlinear transmission line microwave generation device having a pulse recirculating circuit according to some embodiments.

FIG. 2 is a block diagram of a high frequency electromagnetic radiation generation device 200 having a pulse recirculating circuit according to some embodiments. In some embodiments, the pulse recirculating circuit may include a filter 205, a diode 210, and/or a transmission line 215. The filter 205, for example, may include any type of filter that can ensure RF frequencies are being sent to the load 120. As an example, the filter 205 can include a capacitor and/or an inductor. The filter 205, for example, can include any type of low pass filter such as, for example, an LC, RC, RL, and/or RLC filter. As another example, a higher order filter may also be used.

The transmission line 215 may include a delay line that can be used to set the delay time between pulses. The transmission line 215 may provide a delay, for example, that is consistent with delay between pulses provided by the pulser 105. The transmission line 215 may include tunable switches, inductors, capacitors, resistors, etc. In some embodiments, the transmission line 215 can include a length of conducting material (e.g., a wire or cable) where the length of the transmission line and/or the type of conducting material can set the amount delay introduced by the transmission line. In some embodiments, the delay, $t_{delay}$, introduced by the transmission line 215 may be a determined from the pulse repetition frequency, $PRF_{pulser}$, of the nanosecond pulser 105 and the number of times, N, the pulse went through the recirculating circuit between the pulses from the pulser 105, such as, for example:

$$N(t_{delay} + t_{NLTL}) = \frac{1}{PRF_{pulser}}.$$

In addition, the pulse repetition frequency of the electromagnetic radiation, $PRF_{RF}$, is:

$$PRF_{RF} = PRF_{pulser} * N.$$

In some embodiments, the pulser 105 may provide an initial pulse having an initial voltage with an initial current draw providing an initial energy to the nonlinear transmission line. The pulser may provide subsequent pulses that have the same voltage, but provide a lower current draw and, therefore, a lower energy to the nonlinear transmission line. The subsequent pulses may be combined with recirculated pulses. For example, each subsequent pulse may be combined with a recirculated pulse at the input of the nonlinear transmission line 115. In some embodiments, the subsequent pulses may have a voltage that is 20%, 30%, 40%, 50% or 60% of the initial energy. In some embodiments, after a given number of subsequent pulses (e.g., 5, 10, 20, etc. pulses) another pulse may be provided that has the initial voltage.

Figure 3:
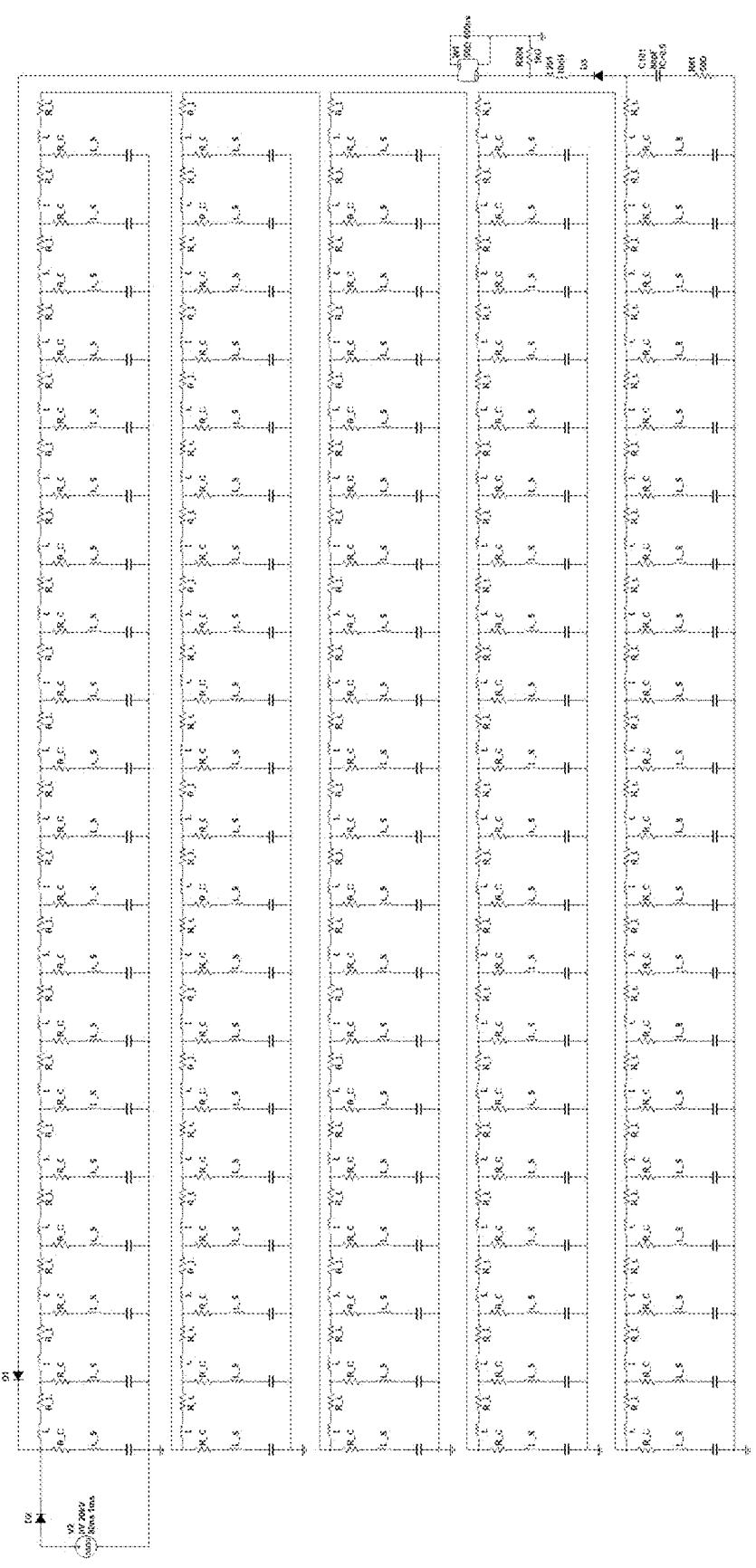
FIG. 3 is a circuit diagram of a nonlinear transmission line with a pulse recirculating circuit according to some embodiments.

FIG. 3 is a circuit diagram of a nonlinear transmission line with a pulse recirculating circuit according to some embodiments. In this example, the pulse recirculating circuit includes a filter comprising capacitor C101 and inductor L201. The transmission line W1 controls the delay in pulses. In this example, two diodes are shown. Diode D3 is positioned near the load R81. Diode D1 may, for example, be positioned near the input of the nonlinear transmission line. Diode D2 may, for example, be placed between the pulser and the nonlinear transmission line.

Figure 4:
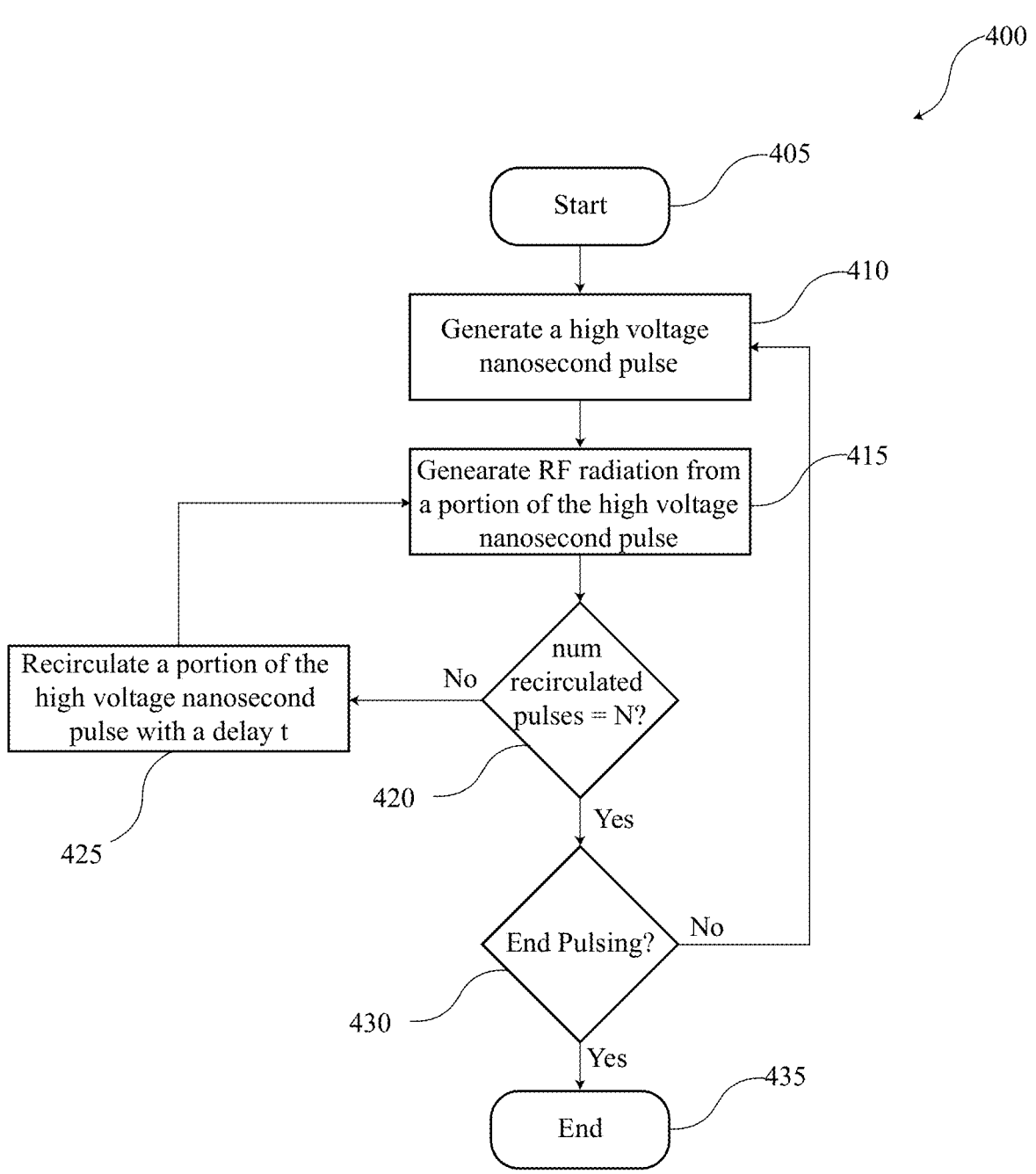
FIG. 4 is an example flow chart of a process for radiating electromagnetic pulses using a pulser with a pulse recirculating circuit according to some embodiments.

FIG. 4 is an example flow chart of a process 400 for radiating electromagnetic pulses using a pulser with a pulse recirculating circuit according to some embodiments. Process 400 starts at block 405. At block 410, a high voltage nanosecond pulse may be generated. The high voltage nanosecond pulse, for example, may be generated by pulser 105. The high voltage nanosecond pulse, for example, may have a rise time less than about 50 ns, ns, 30 ns, 20 ns, 10 ns, etc. The high voltage nanosecond pulse, for example, may have a pulse width less than about 100 ns, 50 ns, 25 ns, 10 ns, 5 ns, etc. The high voltage nanosecond pulse, for example, may have voltage greater than 5 kV, 10 kV, 20 kV, etc.

At block 415 electromagnetic radiation may generated from the high voltage nanosecond pulse. The electromagnetic radiation, for example, may radiate from an antenna at a frequency greater than 100 MHz. In some embodiments, only a portion of the energy from the high voltage nanosecond pulse may be converted to electromagnetic radiation.

At block 420, it can be determined if the number of recirculated pulses is lower than the desired number of recirculated pulses, N, then process 400 proceeds to block 425. Additionally or alternatively, at block 420 it can be determined whether voltage of the pulse from the nonlinear transmission line is less than a threshold voltage.

At block 425, the portion of the high voltage nanosecond pulse not converted to electromagnetic radiation may be recirculated through a portion of the circuitry with a delay t. In some embodiments, a portion of the high voltage nanosecond pulse not converted to electromagnetic radiation may be recirculated regardless of the number of recirculated pulses.

If the number of recirculated pulses is equal to or lower than the desired number of recirculated pulses, N, then process 400 proceeds to block 430. At block 430, if the pulsing and creation of electromagnetic radiation is to continue, then process 400 returns to block 410 and another high voltage nanosecond pulse is generated. Thus, using process 400, a single high voltage nanosecond pulse generated at block 410 can produce N electromagnetic pulses.

If the pulsing is complete, as determined at block 430, then process 400 proceeds to block 435, where process 400 ends.

Figure 5:
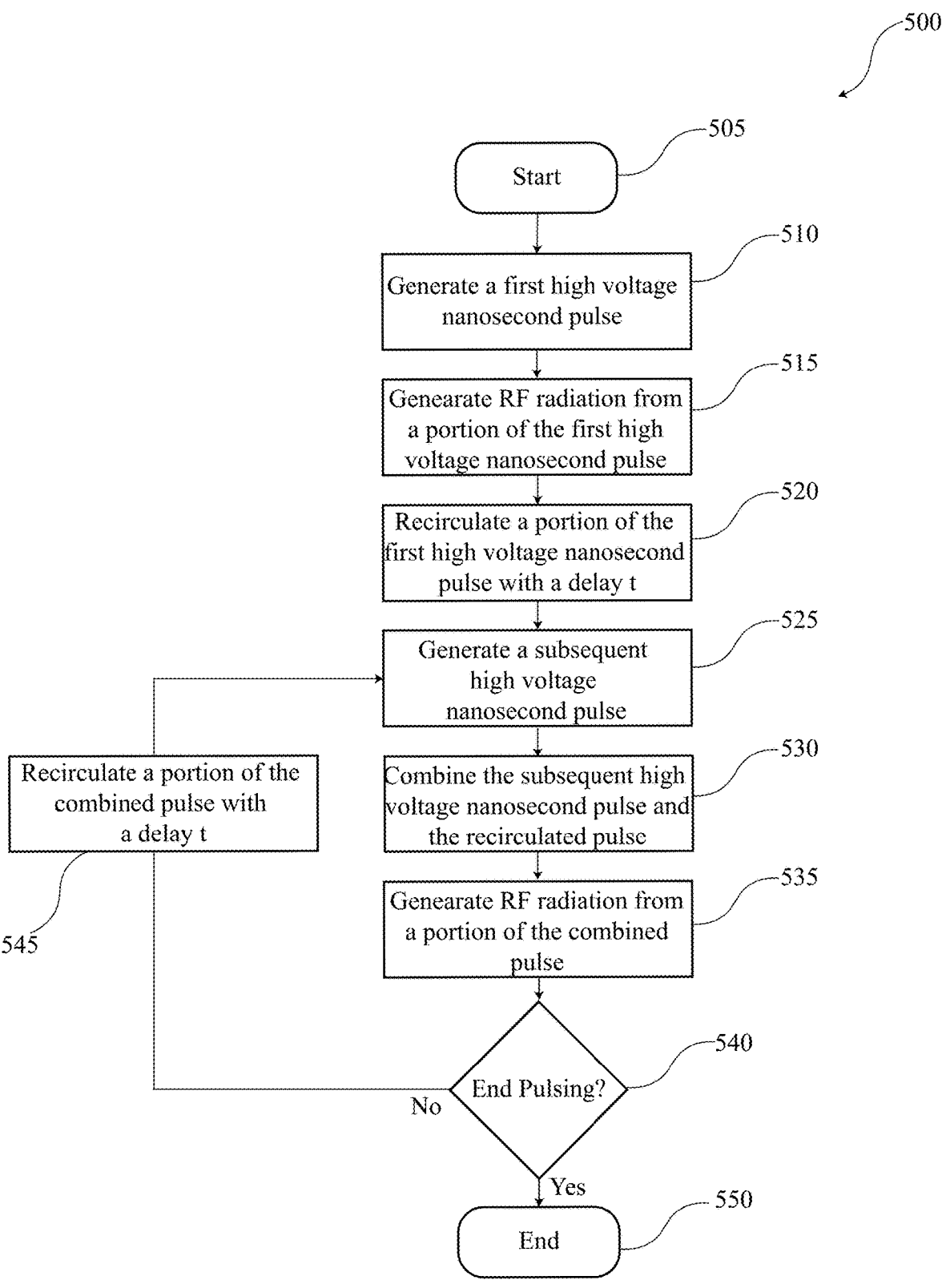
FIG. 5 is an example flow chart of a process for radiating electromagnetic pulses using a pulser with a pulse recirculating circuit according to some embodiments.

FIG. 5 is an example flow chart of a process 500 for radiating electromagnetic pulses using a pulser with a pulse recirculating circuit according to some embodiments. Process 500 starts at block 505. At block 510, a first high voltage nanosecond pulse may be generated. The first high voltage nanosecond pulse, for example, may be generated by pulser 105. The first high voltage nanosecond pulse, for example, may have a rise time less than about 50 ns, 40 ns, 30 ns, 20 ns, 10 ns, etc. The first high voltage nanosecond pulse, for example, may have a pulse width less than about 100 ns, 50 ns, 25 ns, 10 ns, 5 ns, etc. The first high voltage nanosecond pulse, for example, may have voltage greater than 5 kV, 10 kV, etc.

At block 515 electromagnetic radiation may generated from the first high voltage nanosecond pulse. The electromagnetic radiation, for example, may radiate from an antenna at a frequency greater than 100 MHz. In some embodiments, only a portion of the energy from the high voltage nanosecond pulse may be converted to electromagnetic radiation.

At block 520 a portion of the portion of the first high voltage nanosecond pulse not converted to electromagnetic radiation may be recirculated through a portion of the circuitry with a delay t. For example, the portion of the first high voltage nanosecond pulse not converted to electromagnetic radiation may be recirculated through the recirculating circuit 125.

At block 525 a subsequent high voltage nanosecond pulse may be generated. The subsequent high voltage nanosecond pulse, for example, may be generated by pulser 105. The subsequent high voltage nanosecond pulse, for example, may have a rise time less than about ns, 40 ns, 30 ns, 20 ns, 10 ns, etc. The subsequent high voltage nanosecond pulse, for example, may have a pulse width less than about 100 ns, 50 ns, 25 ns, 10 ns, 5 ns, etc. The subsequent high voltage nanosecond pulse, for example, may have voltage greater than 5 kV, kV, 20 kV, etc. In some embodiments, the subsequent high voltage nanosecond pulse may have a voltage substantially equal to the first high voltage nanosecond pulse.

In some embodiments, the subsequent high voltage nanosecond pulse may draw a current that is less than the current drawn by the first high voltage nanosecond pulse. In some embodiments, the subsequent high voltage nanosecond pulse may have a power less than the power of the first high voltage nanosecond pulse.

In some embodiments, the subsequent high voltage nanosecond pulse may have a current draw and/or power that varies based on the current and/or power of the recirculated pulse.

At block 530, the subsequent high voltage nanosecond pulse and the recirculated pulse can be combined. This combination can occur, for example, by timing the recirculated pulse with the timing of the subsequent high voltage nanosecond pulse.

At block 535, electromagnetic radiation may be generated from the combined pulse. The electromagnetic radiation, for example, may radiate from an antenna at a frequency greater than 100 MHz. In some embodiments, only a portion of the energy from the high voltage nanosecond pulse may be converted to electromagnetic radiation.

At block 540, if the pulsing and creation of electromagnetic radiation is to continue, then process 500 proceeds to block 545, otherwise process 500 proceeds to block 550 and process 500 ends. At block 540 it may be determined to discontinue pulsing if the voltage of the combined pulse is below a threshold.

At block 545, a portion of the portion of the combined pulse not converted to electromagnetic radiation may be recirculated through a portion of the circuitry with a delay t. For example, the portion of the combined pulse not converted to electromagnetic radiation may be recirculated through the recirculating circuit 125. Process 500 may proceed to block 525.

Blocks 525, 530, 535, 540, and 545 of process 500 may repeat for any number of cycles.

In some embodiments, if the voltage of a recirculated pulse drops below a threshold value, then process 500 may proceed to block 510.

Figure 6:
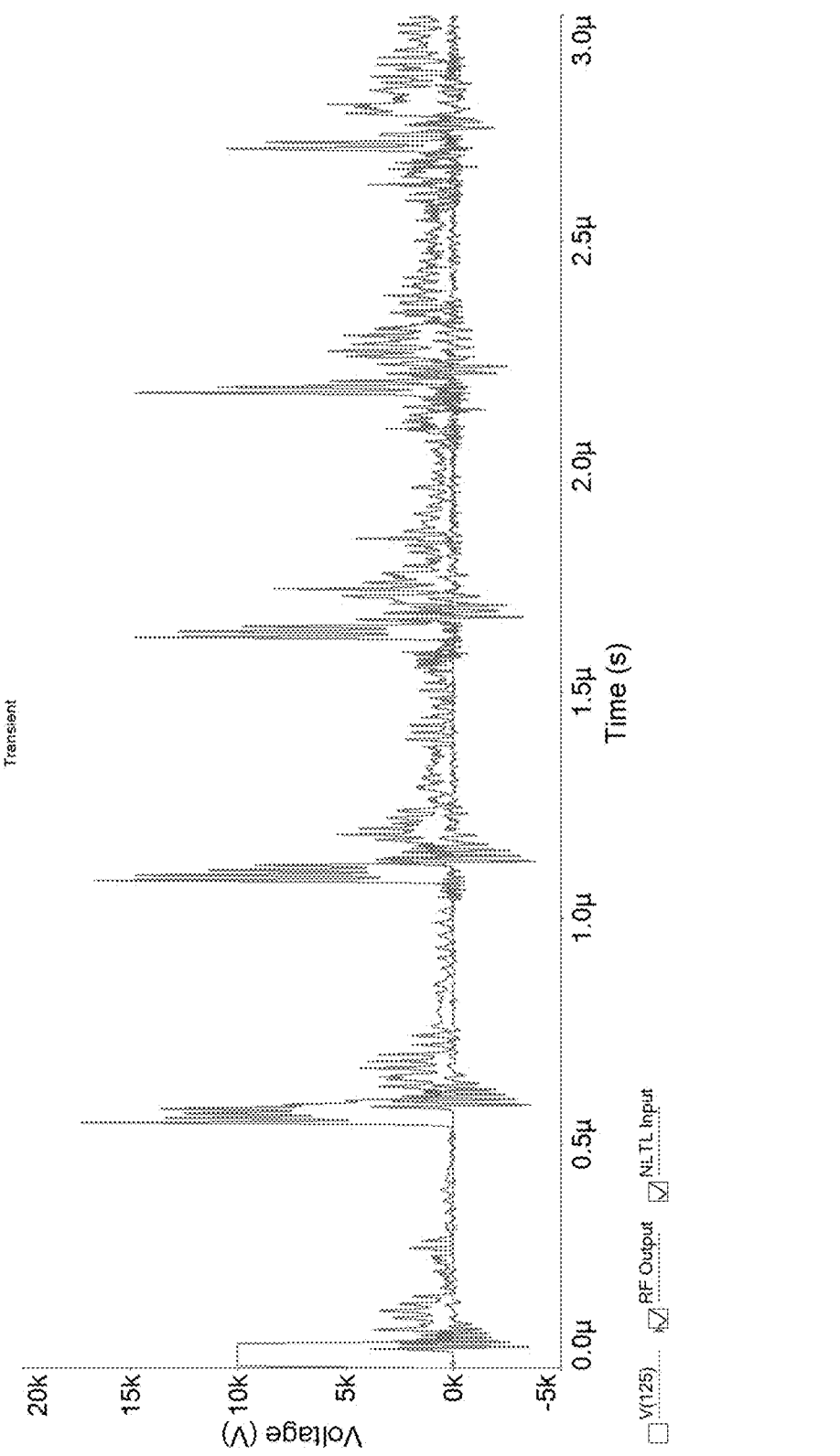
FIG. 6 is a diagram showing an output on a load and an output from a nonlinear transmission line according to some embodiments.

FIG. 6 is a diagram showing the output at the load and the output at the nonlinear transmission line according to some embodiments. As shown, the high voltage output of the nonlinear transmission line is initially a square wave pulse provided by the pulser 105 and travels through the nonlinear transmission line 115. Later the high voltage pulses can be pulses recirculated from the output of the nonlinear transmission line using the pulse recirculating circuit 125. These high voltage pulses can create discrete electromagnetic pulses. In this example, the discrete electromagnetic pulses can be about 50 ns in length. In this example, a single high voltage pulse from the pulser 105 can produce a plurality of electromagnetic pulses every 500 ns. The first pulse can be provided directly from the pulser and the other high voltage pulses can be provided by the pulse recirculating circuit 125.

Figure 7:
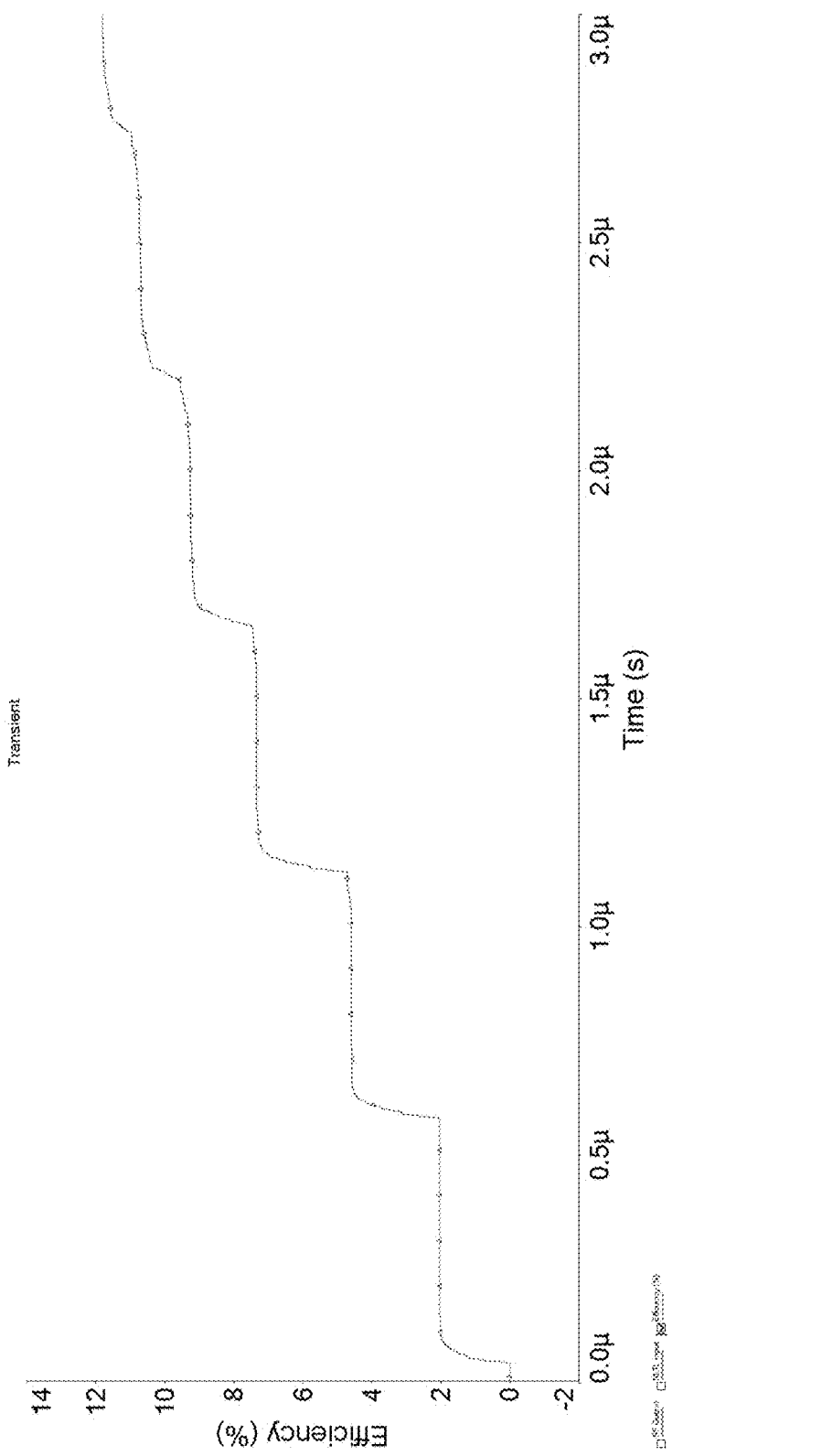
FIG. 7 is a diagram showing energy efficiency versus time using pulse recirculating according to some embodiments.
Figure 8:
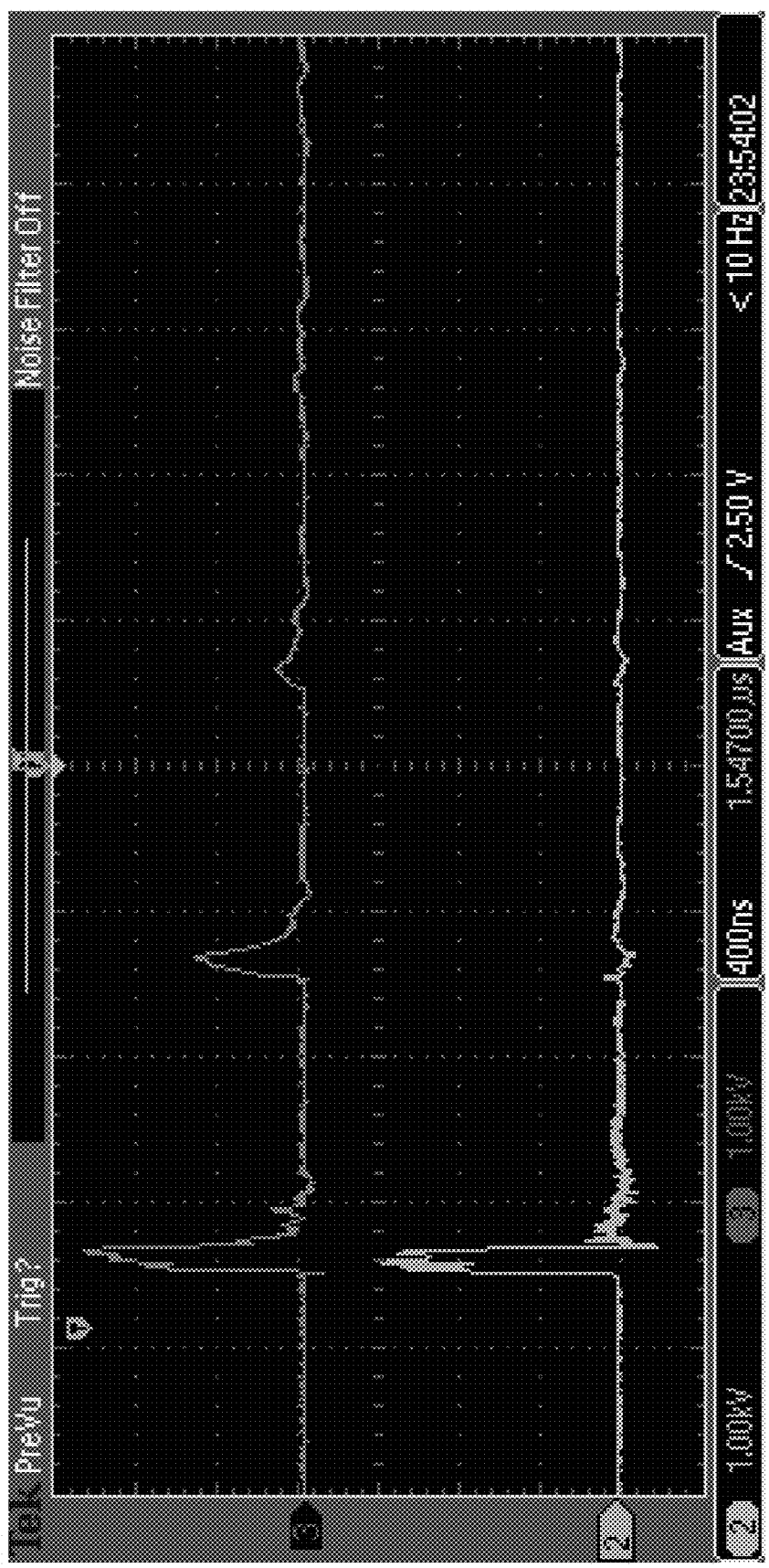
FIG. 8 is a diagram showing a pulse measured across a load and the pulse measured across a load inside the pulse recirculating circuit according to some embodiments.

FIG. 7 is a diagram showing energy efficiency versus time using pulse recirculating according to some embodiments. Here it can be seen that rather than lose the majority of the energy in the broad band pulse the pulse can be reutilized (or recirculated) to increase the overall efficiency of the system. In some embodiments, efficiencies greater than 20%, 30%, 40% or 50% can be achieved, FIG. 8 is a diagram showing a pulse measured across a load and the pulse measured across a load inside the pulse recirculating circuit according to some embodiments.

Figure 9:
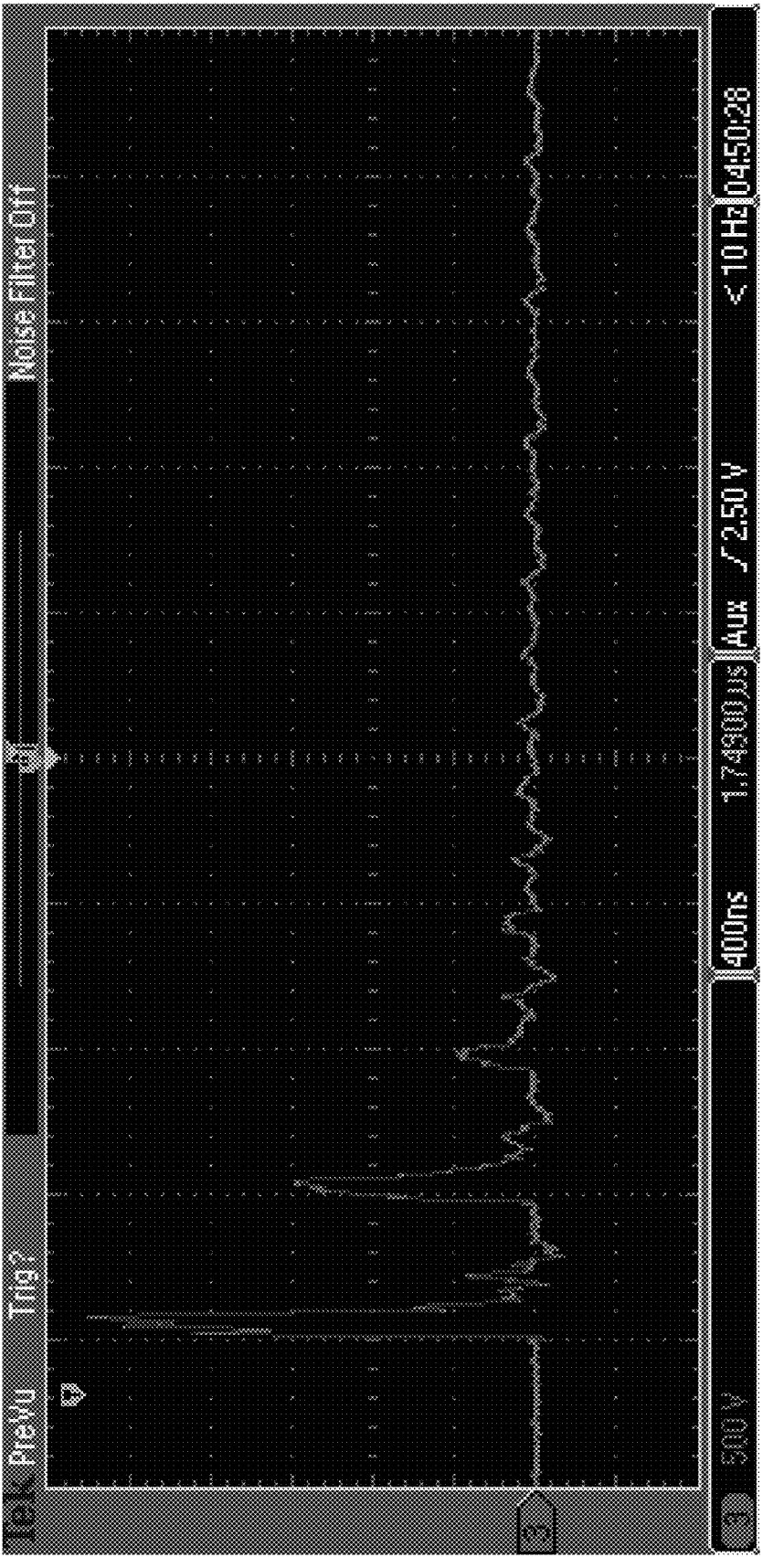
FIG. 9 is a diagram showing a pulse being extinguished overtime according to some embodiments.
Figure 11:
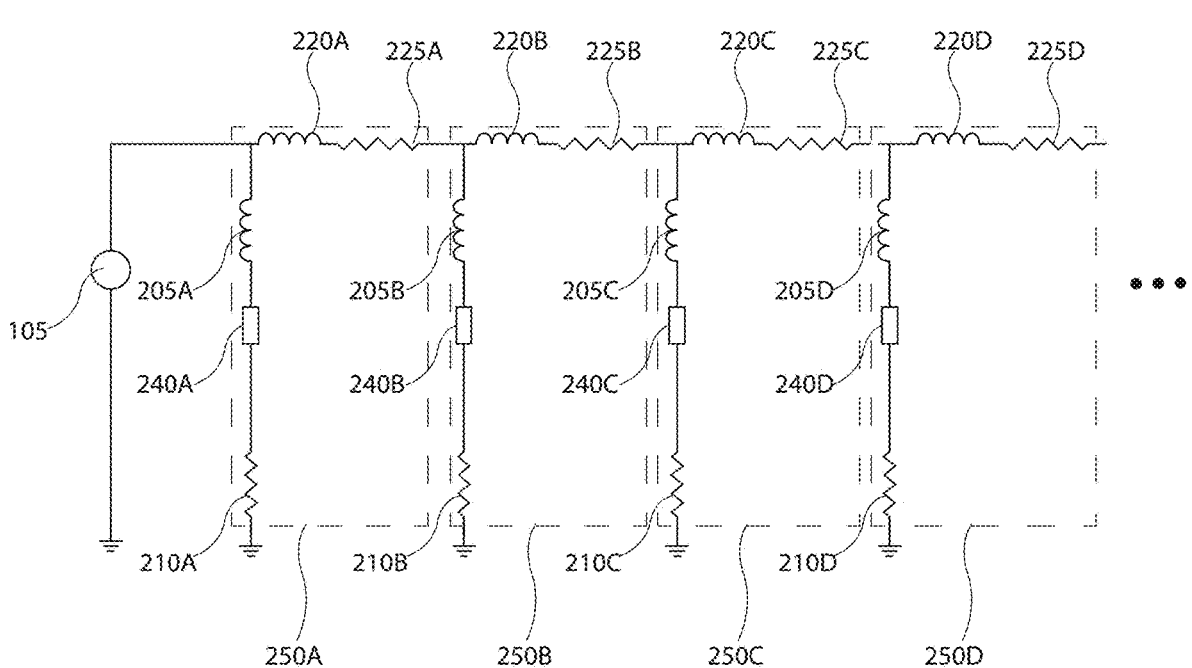
FIG. 11 is a circuit diagram of a nonlinear transmission line according to some embodiments.

FIG. 9 is a diagram showing a pulse being extinguished over time according to some embodiments.

In some embodiments, a nonlinear transmission line may include a plurality of nonlinear semiconductor junction capacitance devices (e.g., nonlinear capacitors). In some embodiments, the nonlinear transmission line may sharpen the rise time of a high voltage input pulse that may, for example, have a variable pulse width and/or a high pulse repetition rate. In some embodiments, the rise time of the input pulse become sharper and sharper as it propagates through the elements of the nonlinear transmission line the output may begin to ring producing a high frequency electromagnetic pulse.

Some embodiments of the invention include the use of a nonlinear semiconductor junction capacitance device as part of the nonlinear transmission line. A nonlinear semiconductor junction capacitance device in some voltage regimes may have a capacitance that varies as voltage across the nonlinear semiconductor junction capacitance device.

A nonlinear semiconductor junction can include a P-type or an N-type junction. A semiconductor junction defined by the boundary between regions of P-type and N-type conductivity material is a capacitor under certain conditions. This junction capacitance arises from the electrical charge of the depletion layer or space-charge region associated with the junction. The space-charge region identifies a volume adjoining the junction on both sides within which the net fixed charge arising from the presence of ionized impurity atoms is not neutralized by mobile charge carriers. Outside of the depletion layer the mobile carriers, holes in the P-type material and electrons in the N-type, are present in almost exactly the right numbers to neutralize the fixed charges.

If the junction is biased slightly in the forward or reverse direction by applying a voltage to a contact on one side of the junction, this voltage urges the hole and electron distributions to move toward or away from each other, respectively. Additional holes and electrons enter or leave the semiconductor at the contacts to maintain the neutrality of the P-type and N-type regions as the depletion layer narrows or widens. Therefore, a certain amount of charge is introduced at the terminals of the device and, neglecting recombination or generation of charge carriers, the same amount of charge returns if the applied voltage is changed back to zero. Thus, the semiconductor junction device is like a capacitor. The relation between the applied voltage and the amount of charge introduced at the terminals is nonlinear; i.e. the capacitance, defined as the rate of change of charge as voltage is changed, depends upon the voltage.

A nonlinear semiconductor junction can also include a metal-semiconductor junction in which a metal is in close contact with a semiconductor material. This close contact between the metal and the semiconductor material can create a junction capacitance that may vary with applied voltage. A metal-semiconductor junction can be referred to as a Schottky barrier diode, Schottky barrier junction, or a point contact diode. A metal-semiconductor junction may include, for example, a metal with either a P-type or an N-type semiconductor region.

In some embodiments, a NSJC device may be a capacitor or a number of plurality of capacitors. In some embodiments, a NSJC device may include two parallel conductors (or a capacitor) etched on a circuit board.

A nonlinear transmission line may include a plurality of circuit elements that each include at least one inductor and at least one NSJC device such as, for example, a capacitor. The speed at which the input pulse propagates the nonlinear transmission line changes as a function of voltage. Thus, the high voltage components of the input pulse propagate down the line faster than the slow voltage components of the input pulse. This can lead to a sharpening of the rising edge of the pulse as it propagates down the line. Each element changes the rise time by approximately:

$$\Delta t_{element} \sim \sqrt{LC(V_{10\%})} - \sqrt{LC(V_{90\%})}.$$

The nonlinear transmission line may sharpen the rising edge of an input pulse sufficiently that a shock at the output from the nonlinear transmission line may form and the output begins to ring producing a high frequency output signal.

Figure 18:
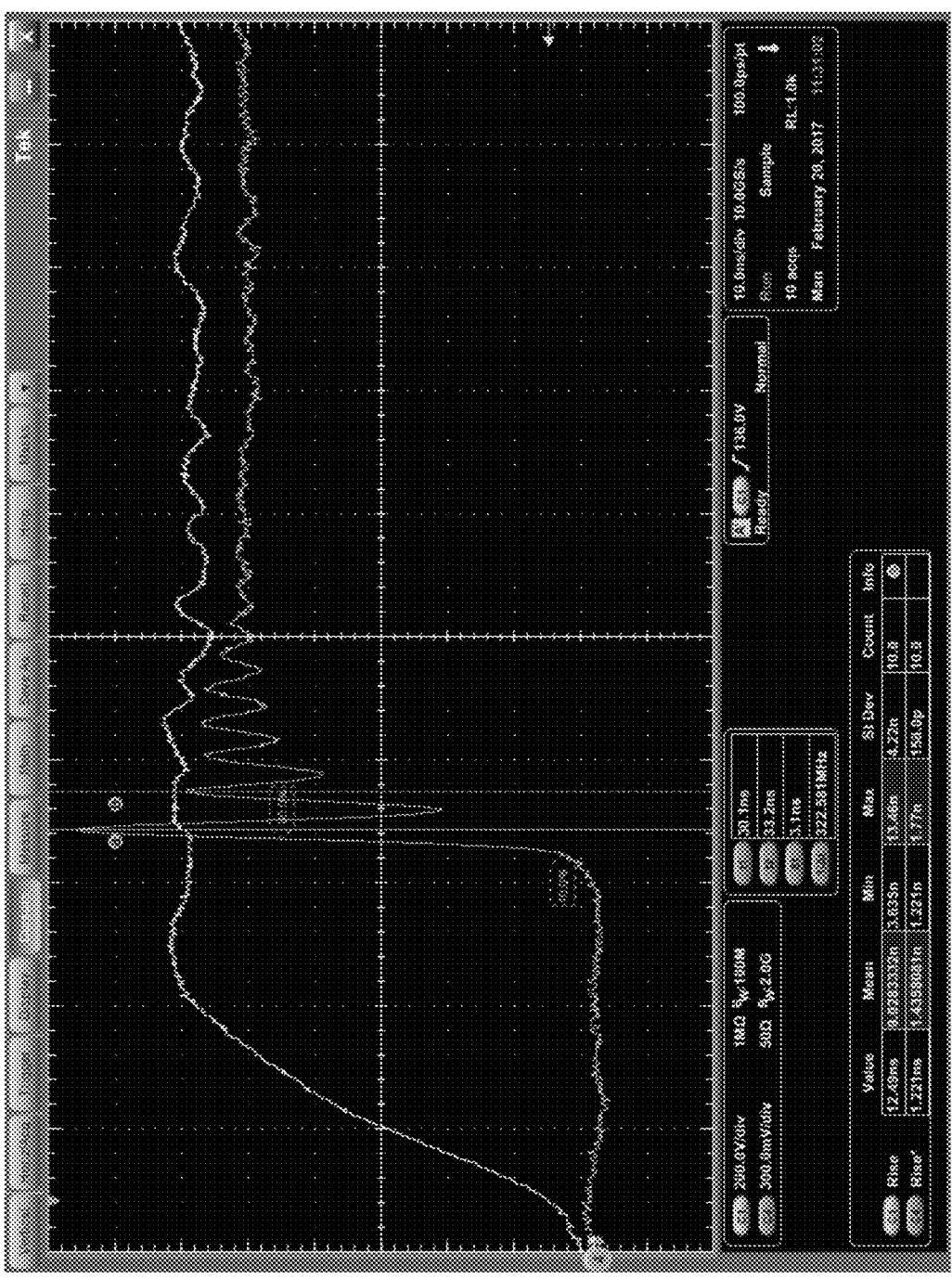
FIG. 18 is a zoomed in portion of the diagram shown in FIG. 17.

FIG. 18 is a circuit diagram of a nonlinear transmission line 1000 according to some embodiments. The nonlinear transmission line 1000 may include an input that can connect to a high voltage pulser 105. In some embodiments, a high voltage pulser may include the nonlinear transmission line 1000.

The nonlinear transmission line 1000 includes a first circuit element 250A that includes a first NSJC device 240A and a first inductor 220A. The first circuit element 250A may be electrically coupled to both the high voltage pulser 105 and ground.

The nonlinear transmission line 1000 includes a second circuit element 250B that includes a second NSJC device 240B and a second inductor 220B. The second circuit element 250B may be electrically coupled to both the first inductor 220A and ground.

The nonlinear transmission line 1000 includes a third circuit element 250C that includes a third NSJC device 240C and a third inductor 220C. The third circuit element 250C may be electrically coupled to both the second inductor 220B and ground.

The nonlinear transmission line 1000 includes a fourth circuit element 250D that includes a fourth NSJC device 240D and a fourth inductor 220D. The fourth circuit element 250D may be electrically coupled to both the third inductor 220C and ground.

The nonlinear transmission line 1000 may include an output that is connected with an antenna that can radiate a high voltage microwave signal.

The nonlinear transmission line 1000 shown in FIG. 18 shows four circuit elements (each having an inductor and an NSJC device). Any number of circuit elements and/or inductors may be included. For example, a nonlinear transmission line may include ten or more circuit elements and/or inductors. As another example, a nonlinear transmission line may include forty or more circuit elements and/or inductors.

In some embodiments, each NSJC device (e.g., NSJC device 240A, 210B, 210C, 210D, etc.) may have an inductance or a stray inductance less than about 500 nH, 250 nH, 100 nH. 50 nH, 25 nH, etc. In some embodiments, each NSJC device (e.g., NSJC device 240A, 210B, 210C, 210D, etc.) may include a plurality of NSJC device in series or parallel.

In some embodiments, each NSJC device (e.g., NSJC device 240A, 210B, 210C, 210D, etc.) may have a zero-voltage capacitance (e.g., the capacitance measured when no voltage is applied to the NSJC device) less than about 10 nH, 1 nH, 500 pH, 250 pH, 100 ph. 50 pH, 25 pH, etc.

In some embodiments, each inductor (e.g., inductor 220A, 240B, 240C, 240D, etc.) may have an inductance less than about 500 nH, 250 nH, 100 nH. 50 nH, 25 nH, etc. In some embodiments, each inductor (e.g., inductor 220A, 240B, 240C, 240D, etc.) may include a plurality of inductors arranged in series or parallel.

FIG. 3 is a circuit diagram of a nonlinear transmission line 1100 according to some embodiments. The circuit diagram of the nonlinear transmission line 1100 shows a number of stray elements such as stray resistance represented as a resistor and stray inductance represented as an inductor.

The nonlinear transmission line 1100 includes a first circuit element 250A that includes a first NSJC device 240A and first inductor 220A. The first circuit element 250A may also include stray inductance, which is schematically represented by inductor 205A. In some embodiments, the stray inductance represented by inductor 205A can represent all or most of the stray inductance of the first circuit element 250A, such as, for example, the inductance of traces in the circuit element, inductance of the NSJC device, etc. The first circuit element 250A may also include stray resistance, which can be schematically represented by resistors 210A and 225A. In some embodiments, the stray resistance represented by resistors 210A and 225A can represent all or most of the stray resistance of the first circuit element 250A such as, for example, the resistance of traces in the circuit element, resistance of the NSJC device, etc.

The nonlinear transmission line 1100 includes a second circuit element 250B that includes a second NSJC device 240B and second inductor 220B. The second circuit element 250B may also include stray inductance, which is schematically represented by inductor 205B. In some embodiments, the stray inductance represented by inductor 205B can represent all or most of the stray inductance of the second circuit element 250B, such as, for example, the inductance of traces in the circuit element, inductance of the NSJC device, etc. The second circuit element 250B may also include stray resistance, which can be schematically represented by resistors 210B and 225B. In some embodiments, the stray resistance represented by resistors 210B and 225B can represent all or most of the stray resistance of the second circuit element 250B.

The nonlinear transmission line 1100 includes a third circuit element 250C that includes a third NSJC device 240C and third inductor 220C. The third circuit element 250C may also include stray inductance, which is schematically represented by inductor 205C. In some embodiments, the stray inductance represented by inductor 205C can represent all or most of the stray inductance of the third circuit element 250C, such as, for example, the inductance of traces in the circuit element, inductance of the NSJC device, etc. The third circuit element 250C may also include stray resistance, which can be schematically represented by resistors 210C and 225C. In some embodiments, the stray resistance represented by resistors 210C and 225C can represent all or most of the stray resistance of the third circuit element 250C such as, for example, the resistance of traces in the circuit element, resistance of the NSJC device, etc.

The nonlinear transmission line 1100 includes a fourth circuit element 250D that includes a fourth NSJC device 240D and fourth inductor 220D. The fourth circuit element 250D may also include stray inductance, which is schematically represented by inductor 205D. In some embodiments, the stray inductance represented by inductor 205D can represent all or most of the stray inductance of the fourth circuit element 250D, such as, for example, the inductance of traces in the circuit element, inductance of the NSJC device, etc. The fourth circuit element 250D may also include stray resistance, which can be schematically represented by resistors 210D and 225D. In some embodiments, the stray resistance represented by resistors 210D and 225D can represent all or most of the stray resistance of the fourth circuit element 250D such as, for example, the resistance of traces in the circuit element, resistance of the NSJC device, etc.

In some embodiments, each one of the plurality of inductors 220A, 220B, 220C, 220D may have a value greater than a respective stray inductance represented by each or any one of inductors 205A, 205B, 205C, 205D.

In some embodiments, the stray resistance represented by resistors 210A, 210B, 210C, 210D may have a resistance less than about 5.0, 2.5, 1.0, 0.5, etc. ohms. In some embodiments, the stray resistance represented by resistors 210A, 210B, 210C, 210D may be minimized. In some embodiments, the stray resistance represented by resistors 210A, 210B, 210C, 210D may include, for example, the internal resistance of the NSJC device and/or any of its connections. In some embodiments, the stray resistance represented by resistors 210A, 210B, 210C, 210D may comprise the resistance of a wire, a trace, a plurality of wires, a plurality of traces, litz wire, etc.

In some embodiments, the stray resistance represented by resistors 225A, 225B, 225C, 225D may be as small as possible. In some embodiments, the stray resistance represented by resistors 225A, 225B, 225C, 225D may be as minimized. In some embodiments, the stray resistance represented by resistors 225A, 225B, 225C, 225D may comprise the resistance of a wire, a trace, a plurality of wires, a plurality of traces, litz wire, etc.

While the transmission line 1100 shown in FIG. 3 shows four circuit elements any number of circuit elements may be used. In some embodiments, each NSJC device 240A, 240B, 240C, or 240D may include one or more NSJC devices in series or parallel (e.g., 2, 3, 5, 7, 9, 12, 15 diodes arranged in series), which may, for example, provide for a NSJC device combination with sufficient operating voltage such as, for example, a combined operating voltage greater than 500 V, 1 kV, 2.5 kV, 5 kV, 10 kV, etc. In some embodiments, each NSJC device 240A, 240B, 240C, or 240D may comprise one or more Schottky diode such as, for example, silicon carbide Schottky diode(s), silicon diodes, or other devices such as, for example, a solid-state switch, FET, MOSFET, IGBT, GAN, SiC, MOSFET, etc.

Each NSJC device 240A, 240B, 240C, or 240D (or combination of diodes), for example, may have a voltage ratings of more than 1.0 kV such as, for example, 1.1, 1.2, 1.3, 1.4, 1.5, 1.6, 1.8, 1.9, 2.0, 2.1, 2.2, 2.3, 3.4 kV. In some embodiments, each NSJC device 240A, 240B, 240C, or 240D (or combination of diodes) may have a respective stray inductance 205A, 205B, 205C, 205D less than about 1,000 nH, 750 nH, 500 nH, 250 nH, 100 nH, 50 nH, 30 nH, 20 nH, 15 nH, 10 nH, etc.

While the nonlinear transmission line 1100 shown in FIG. 3 shows four inductors 220A, 220B, 220C, 220D any number of inductors may be used. The inductors, for example, may have an inductance less than about 250 nH, 100 nH, 50 nH, 25 nH, 10 nH, etc.

In some embodiments, the nonlinear transmission line 1100 may be coupled with a nanosecond pulser that can produce a high voltage pulse train with a plurality of pulses. The high voltage pulse train produced by the nanosecond pulser may have any number of characteristics such as, for example, having a voltage such as, for example, above 1 kV, 2.5 kV, 5 kV, 10 kV, 15 kV, 20 kV, etc.; and a fast rise time such as, for example, a rise time less than about 50 ns, 40 ns, 30 ns, 20 ns, 10 ns, etc., etc. The plurality of pulses of the high voltage pulse train may, for example, have variable pulse widths (e.g., 3-275 ns).

FIG. 12 is a circuit diagram of a nonlinear transmission line 1200 according to some embodiments. The circuit diagram of the nonlinear transmission line 1200 shows a number of stray elements such as stray resistance represented as a resistor and stray inductance represented as an inductor. In addition, the circuit diagram of the nonlinear transmission line 1200 includes two inductors within each circuit element.

In some embodiments, the nonlinear transmission line 1200 may include a plurality circuit elements that each include a NSJC device. In this example, each circuit element includes two inductors.

The nonlinear transmission line 1200 includes a first circuit element 250A that includes a first NSJC device 240A, a first lower inductor 220A, and a first upper inductor 221A. The first circuit element 250A may also include stray inductance, which is schematically represented by inductor 205A. In some embodiments, the stray inductance represented by inductor 205A can represent all or most of the stray inductance of the first circuit element 250A, such as, for example, the inductance of traces in the circuit element, inductance of the NSJC device, etc. The first circuit element 250A may also include stray resistance, which can be schematically represented by resistors 210A, 225A, and 226A. In some embodiments, the stray resistance represented by resistors 210A, 225A, and 226A can represent all or most of the stray resistance of the first circuit element 250A such as, for example, the resistance of traces in the circuit element, resistance of the NSJC device, etc.

The nonlinear transmission line 1200 includes a second circuit element 250B that includes a second NSJC device 240B, second lower inductor 220B, and second upper inductor 221B. The second circuit element 250B may also include stray inductance, which is schematically represented by inductor 205B. In some embodiments, the stray inductance represented by inductor 205B can represent all or most of the stray inductance of the second circuit element 250B, such as, for example, the inductance of traces in the circuit element, inductance of the NSJC device, etc. The second circuit element 250B may also include stray resistance, which can be schematically represented by resistors 210B, 225B, and 226B. In some embodiments, the stray resistance represented by resistors 210B, 225B, and 226B can represent all or most of the stray resistance of the second circuit element 250B such as, for example, the resistance of traces in the circuit element, resistance of the NSJC device, etc.

The nonlinear transmission line 1200 includes a third circuit element 250C that includes a third NSJC device 240C, third lower inductor 220C, and third upper inductor 221C. The third circuit element 250C may also include stray inductance, which is schematically represented by inductor 205C. In some embodiments, the stray inductance represented by inductor 205C can represent all or most of the stray inductance of the third circuit element 250C, such as, for example, the inductance of traces in the circuit element, inductance of the NSJC device, etc. The third circuit element 250C may also include stray resistance, which can be schematically represented by resistors 210C, 225C, and 226C. In some embodiments, the stray resistance represented by resistors 210C, 225C, and 226C can represent all or most of the stray resistance of the third circuit element 250C such as, for example, the resistance of traces in the circuit element, resistance of the NSJC device, etc.

The nonlinear transmission line 1200 includes a fourth circuit element 250D that includes a fourth NSJC device 240D, fourth lower inductor 220D, and fourth upper inductor 221D. The fourth circuit element 250D may also include stray inductance, which is schematically represented by inductor 205D. In some embodiments, the stray inductance represented by inductor 205D can represent all or most of the stray inductance of the fourth circuit element 250D, such as, for example, the inductance of traces in the circuit element, inductance of the NSJC device, etc. The fourth circuit element 250D may also include stray resistance, which can be schematically represented by resistors 210A, 225D, and 226D. In some embodiments, the stray resistance represented by resistors 210D, 225D, and 226D can represent all or most of the stray resistance of the fourth circuit element 250D such as, for example, the resistance of traces in the circuit element, resistance of the NSJC device, etc.

In some embodiments, an inductor pair, for example, inductor pairs 220A and 221A, 220B and 221B, 220C and 221C, 220D and 221D may be electrically coupled between two circuit elements and/or a circuit element and an output. In some embodiments, each one of the plurality of inductors 220A, 220B, 220C, 220D, 221A, 221B, 221C, 221D, may have a value greater than a respective stray inductance represented by one of inductors 205A, 205B, 205C, 205D.

In some embodiments, the stray resistance represented by resistors 210A, 210B, 210C, 210D may have a resistance less than about 5.0, 2.5, 1.0, 0.5, etc. ohms. In some embodiments, the stray resistance represented by resistors 210A, 210B, 210C, 210D may be minimized. In some embodiments, the stray resistance represented by resistors 210A, 210B, 210C, 210D may comprise the resistance of a wire, a trace, a plurality of wires, a plurality of traces, litz wire, etc.

While the transmission line 1200 shown in FIG. 12 shows four circuit elements any number of circuit elements may be used. In some embodiments, each NSJC device 240A, 240B, 240C, 240D may include one or more NSJC devices in series or parallel (e.g., 2, 3, 5, 7, 9, 12, 15 diodes arranged in series), which may, for example, provide for a NSJC device combination with sufficient operating voltage such as, for example, a combined operating voltage greater than 500 V, 1 kV, 2.5 kV, 5 kV, 10 kV, etc. In some embodiments, each NSJC device 240A, 240B, 240C, or 240D may comprise one or more Schottky diode such as, for example, silicon carbide Schottky diode(s), silicon diodes, or other.

In some embodiments, each NSJC device 240A, 240B, 240C, or 240D (or combination of diodes), for example, may have a voltage ratings of more than 1.0 kV such as, for example, 1.1, 1.2, 1.3, 1.4, 1.5, 1.6, 1.8, 1.9, 2.0, 2.1, 2.2, 2.3, 3.4 kV. In some embodiments, each NSJC device 240A, 240B, 240C, or 240D (or combination of diodes) may have a respective stray inductance 205A, 205B, 205C, 205D less than about 1,000 nH, 750 nH, 500 nH, 250 nH, 100 nH, 50 nH, 30 nH, 20 nH, 15 nH, 10 nH, etc.

While the nonlinear transmission line 1200 shown in FIG. 12 shows four inductor pairs 220A and 221A, 220B and 221B, 220C and 221C, 220D and 221D any number of inductors may be used. The inductors 220A, 220B, 220C, 220D, for example, may have an inductance less than about 250 nH, 100 nH, 50 nH, 25 nH, 10 nH, etc.

In some embodiments, the nonlinear transmission line 1200 may be coupled with a nanosecond pulser that can produce a high voltage pulse train with a plurality of pulses.

The high voltage pulse train produced by the nanosecond pulser may have any number of characteristics such as, for example, having a voltage such as, for example, above 1 kV, 2.5 kV, 5 kV, 10 kV, 15 kV, 20 kV, etc.; and a fast rise time such as, for example, a rise time less than about 50 ns, 40 ns, 30 ns, 20 ns, 10 ns, etc., etc. The plurality of pulses of the high voltage pulse train may, for example, have variable pulse widths (e.g., 3-275 ns).

In some embodiments, a nonlinear transmission line can include a NSJC device that has the following capacitance:

$$C(V) = \frac{C_{j0}}{(1 + V/\phi)^m}. \tag{V}$$

Where $C_{j0}$ is the junction capacitance of the NSJC at zero voltage. V is the voltage. $\phi$ is the junction potential. m is a constant value between 0.25 and 0.75 that varies based on the type of NSJC.

The following table provides some example values for a nonlinear transmission line that can be used to create high voltage microwave pulses at various frequencies. In some embodiments, each value may range from the 25% below the listed LF value to 25% above the listed HF value.

| Variable | Description | LF Value | HF Value |
|---|---|---|---|
| $C_{j0}$ | Junction capacitance at zero voltage | 1.3856 nF | 173.2 pF |
| $\phi$ | | 1.75 V | 1.75 V |
| m | For a silicon carbide (SiC) device | 0.5 | 0.5 |
| $L_{stray}$ | Stray inductance (205.) | 100 pH | 100 pH |
| L | Inductance (220.) | 48 nH | 6 nH |
| $R_L$ | Stray resistance in inductor leg (225) | 100 mΩ | 10 mΩ |
| $R_C$ | Stray resistance in capacitor leg (210) | 100 mΩ | 10 mΩ |
| N | Number of elements | 30 | 140 |
| $f_{RF}$ | Measured RF frequency | 325 MHz | 2.4 GHz |
| $\omega_{RF}$ | RF angular frequency | $2.0 \times 10^9$ s$^{-1}$ | $15.1 \times 10^9$ s$^{-1}$ |
| $\omega_{Bragg}$ | Bragg cutoff frequency | $2.13 \times 10^9$ s$^{-1}$ | $17.1 \times 10^9$ s$^{-1}$ |

Figure 13:
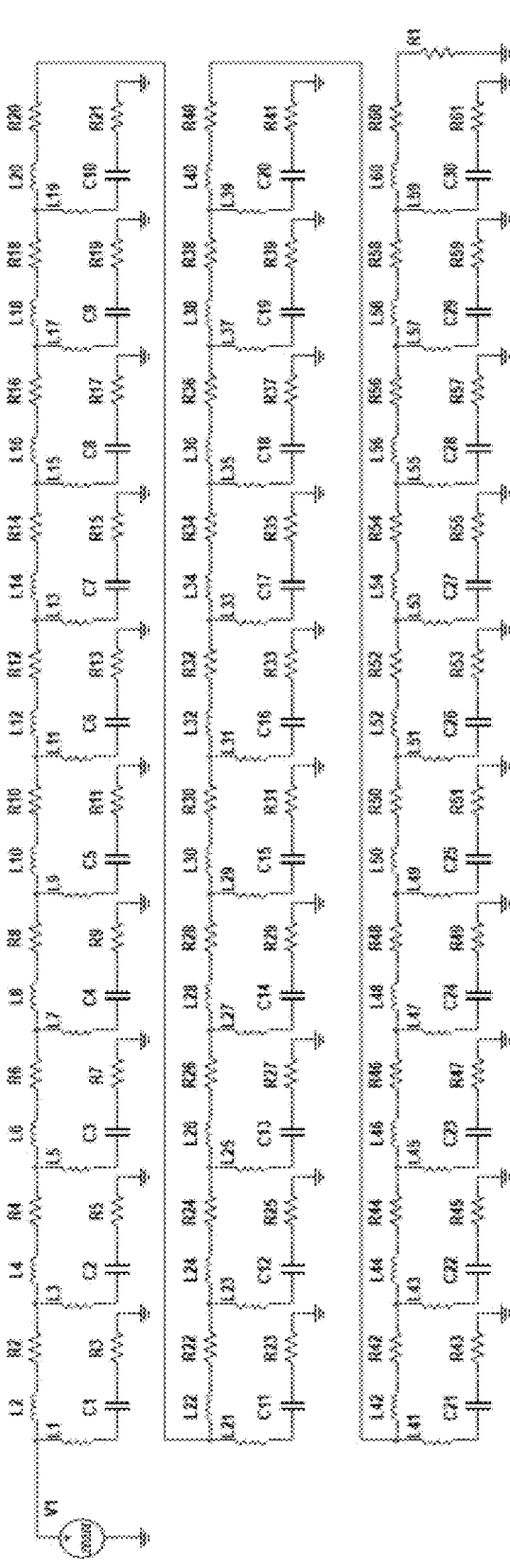
FIG. 13 is a circuit diagram of a nonlinear transmission line according to some embodiments.
Figure 14:
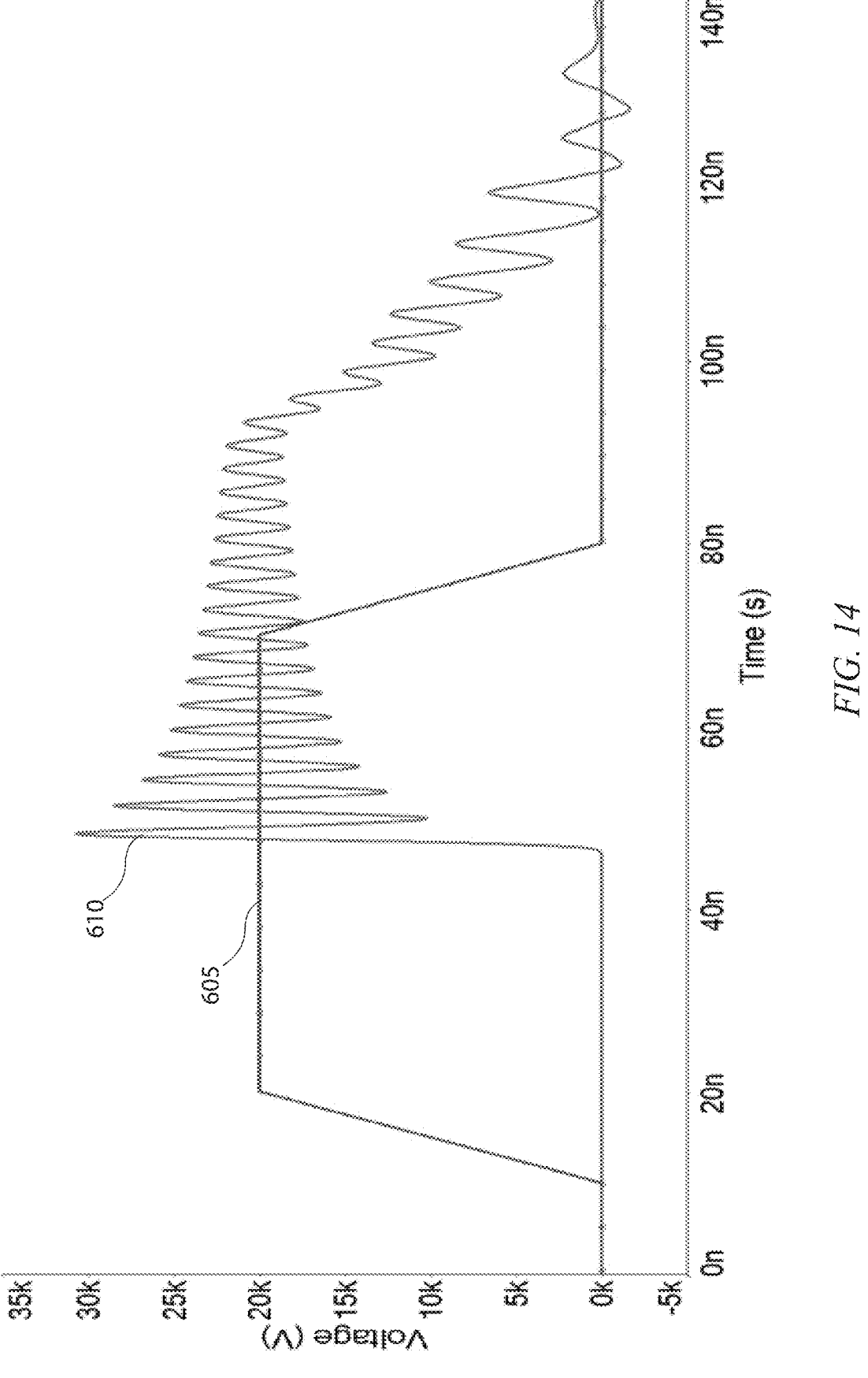
FIG. 14 is an input and output waveform of a nonlinear transmission line microwave generation device according to some embodiments.

FIG. 13 is a circuit diagram a nonlinear transmission line 1300 with 30 circuit elements according to some embodiments. FIG. 14 is a diagram of an input pulse 605 from a high voltage pulser 105 and an output pulse 610 after propagating through the nonlinear transmission line 1300 shown in FIG. 13. As shown in the diagram, the input pulse 605 is 20 kV pulse with a 60 ns flat top and a rise time of 10 ns. The output pulse is a high voltage signal with a frequency of 325 MHz. The various elements in the nonlinear transmission line 1300 may have the LF Values listed in the table above.

Figure 15:
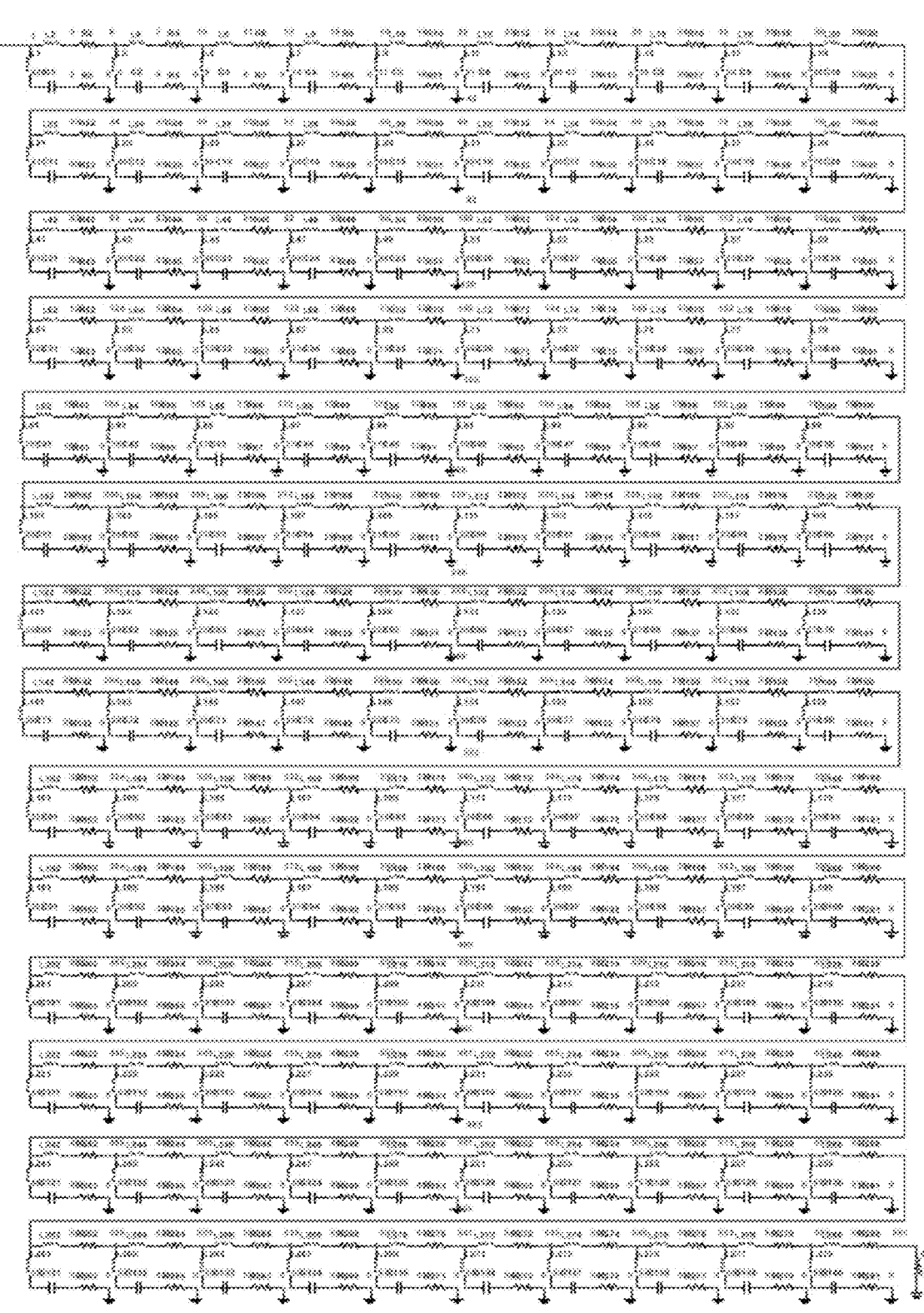
FIG. 15 is a circuit diagram of a nonlinear transmission line according to some embodiments.
Figure 16:
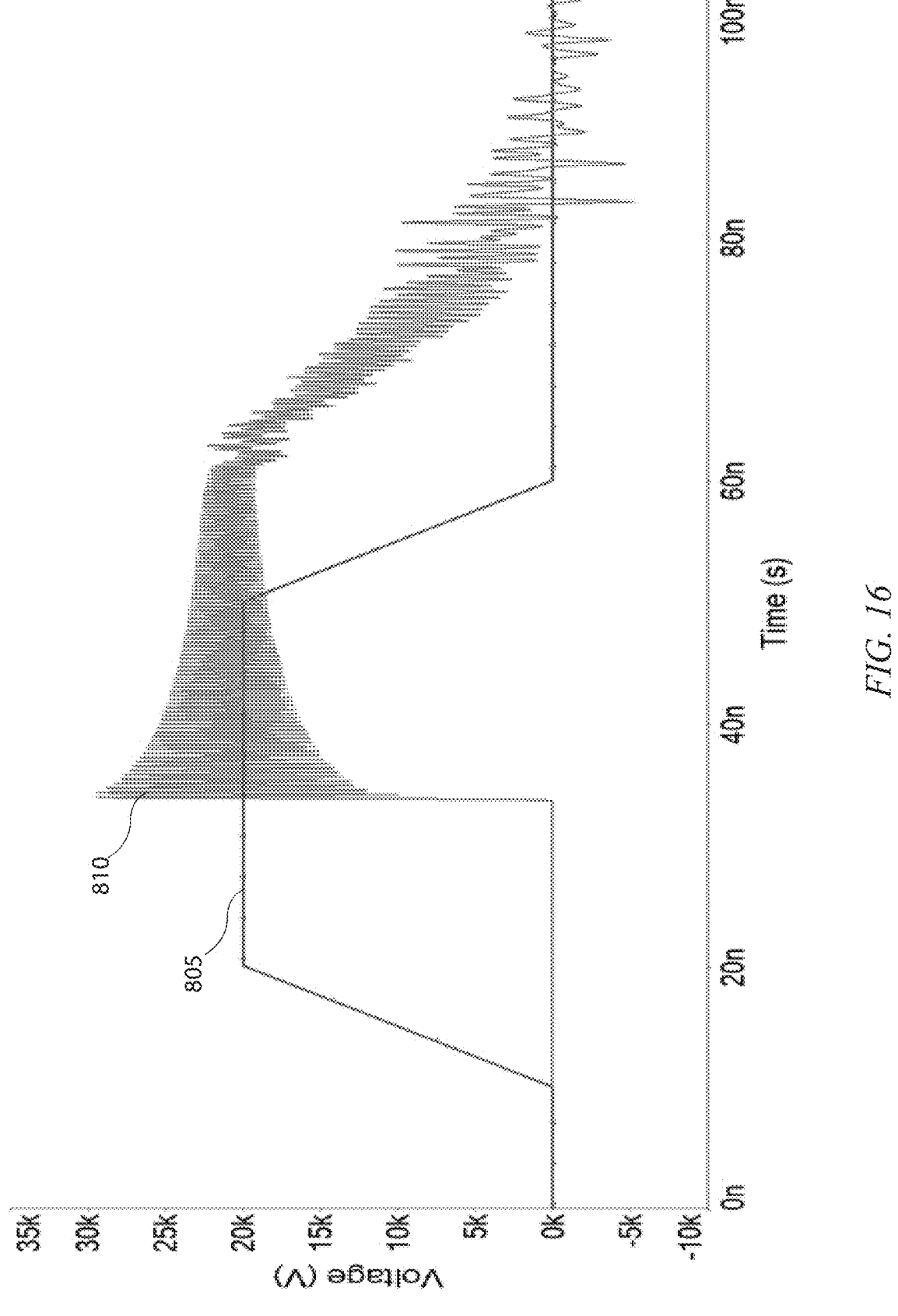
FIG. 16 is an input and output waveform of a nonlinear transmission line microwave generation device according to some embodiments.

FIG. 15 is a circuit diagram a nonlinear transmission line with 140 circuit elements according to some embodiments. FIG. 16 is a diagram of an input pulse 805 from a high voltage pulser 105 and an output pulse 810 after propagating through the nonlinear transmission line shown in FIG. 15. As shown in the diagram, the input pulse 805 is 20 kV pulse with a 60 ns flat top and a rise time of 10 ns. The output pulse is a high voltage signal with a frequency of 2.4 GHz. The various elements in the nonlinear transmission line in FIG. 15 may have the HF Values listed in the table above.

FIG. 13 and FIG. 15 illustrate two examples of nonlinear transmission lines have various component values. These values may vary based on implantation and/or design.

In some embodiments, a nonlinear transmission line can include a NSJC device (e.g., a Schottky diode) that has the following capacitance:

$$C_s = \frac{1}{n} \frac{C_{j0}}{\sqrt{1 + V_s / n\varphi}}$$

In some embodiments, the overall capacitance, $C_s$, of the nonlinear transmission line will decrease with increased number of diode (or NSJC device) sections n. $C_{j0}$ is the junction capacitance at zero voltage of a single diode, φ is the junction potential and $V_s$ is the voltage across the nonlinear transmission line.

In some embodiments, as a general rule of thumb, in some conditions, the characteristic impedance of a nonlinear transmission line may be less than about 180 ohms. In some embodiments, the inductance of the nonlinear transmission line can be calculated, for example, to impedance match to 180Ω using the following formula, where $V_{40\%}$ is 40% of $V_{max}$:

$$Z = \sqrt{\frac{L}{C(V_{40\%})}}.$$

In some embodiments, the impedance of the nonlinear transmission line may vary as a function of the voltage applied and/or, for example, time, as the input pulse is applied.

Figure 17:
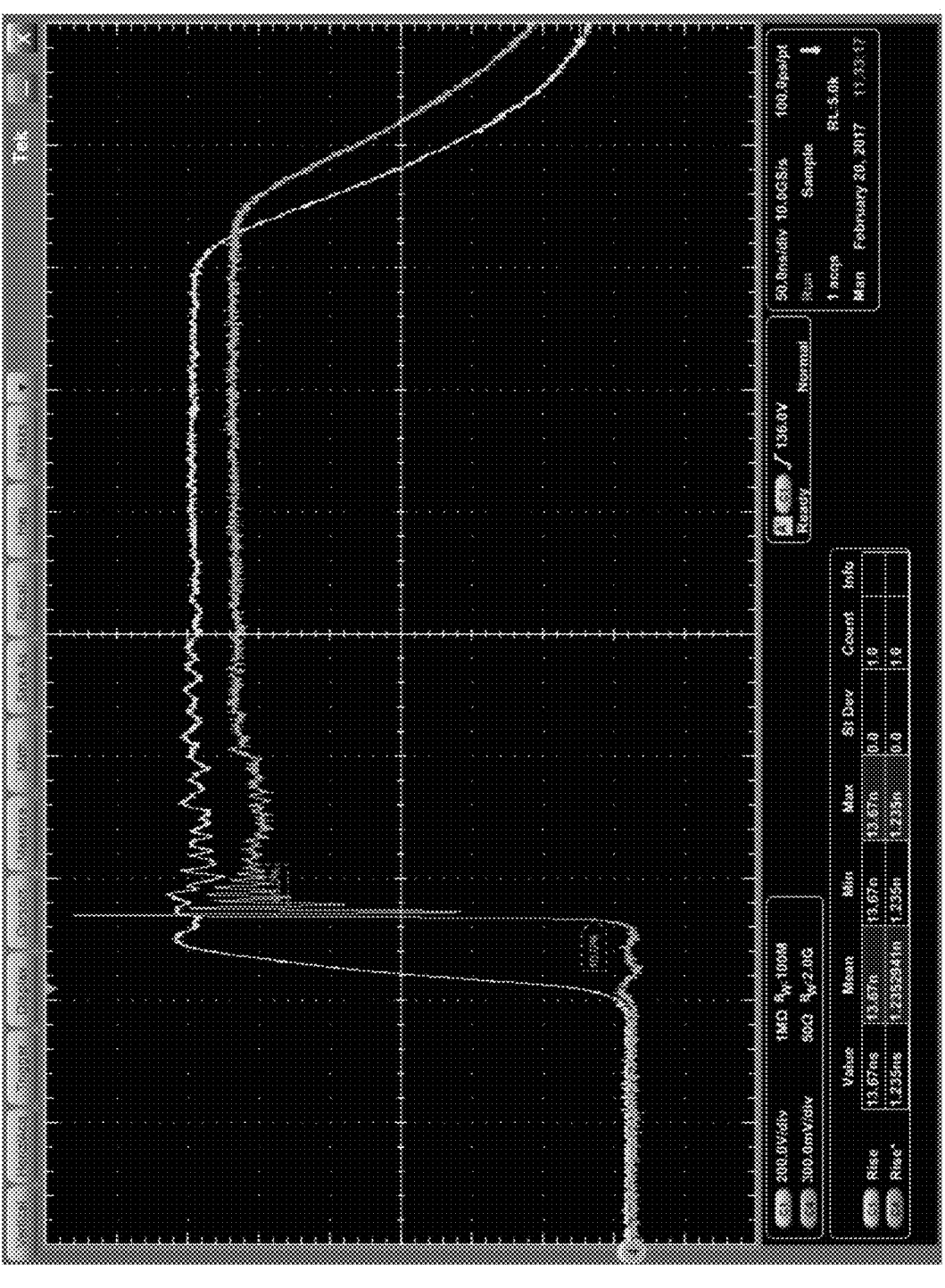
FIG. 17 is a diagram of an input pulse from a high voltage pulser and an output pulse after propagating through the nonlinear transmission line according to some embodiments.

FIG. 17 is a diagram of an input pulse from a high voltage pulser and an output pulse after propagating through the nonlinear transmission line according to some embodiments. FIG. 18 is a zoomed in portion of the diagram shown in FIG. 17. In this example, the input pulse has a fast rise time (e.g., ~12.5 ns) and the output pulse has a faster front end rise time (e.g., ~1.2 ns). In this example, the output pulse has a frequency of 323 MHz oscillating at 6 kV.

The term "substantially" means within 5% or 10% of the value referred to or within manufacturing tolerances.

Various embodiments are disclosed. The various embodiments may be partially or completely combined to produce other embodiments.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

That which is claimed is:

1. A high powered microwave radiation generation device comprising:
   a high voltage pulser comprising a plurality of solid-state switches, the high voltage pulser has a low stray inductance and a low stray capacitance, the high voltage pulser produces a plurality of electrical pulses having a first peak voltage that is greater than 1 kV and a pulse repetition frequency between 10 kHz and 100 kHz;
   a transmission line comprising a plurality of inductors and capacitors that is electrically coupled with the high voltage pulser, wherein the transmission line shapes the electrical pulses from the high voltage pulser; and
   an antenna electrically coupled with the nonlinear transmission line that has an impedance less than 0.5 ohms, and radiates electromagnetic radiation at a frequency greater than 100 MHz.

2. The high powered microwave radiation generation device according to claim 1, wherein the transmission line comprises a plurality of circuit elements that include a nonlinear semiconductor junction capacitance device and an inductor.

3. The high powered microwave radiation generation device according to claim 1, wherein the transmission line comprises a nonlinear transmission line selected from the group consisting of a gyromagnetic nonlinear transmission line, a ferrite based nonlinear transmission line, lumped element nonlinear transmission line, a parallel plate segmented nonlinear transmission line, and a magnetic lumped element nonlinear transmission line.

4. The high powered microwave radiation generation device according to claim 1, further comprising:
   a pulse recirculating circuit electrically coupled with the high voltage input and the antenna, the pulse recirculating circuit comprising:
   a diode;
   a low pass filter; and
   a delay line;
   wherein unradiated energy from the antenna is directed through the pulse recirculating circuit to the nonlinear transmission line with a delay of less than 500 ns.

5. High powered microwave radiation generation device according to claim 1, wherein the impedance of the transmission line is matched with the impedance of the antenna.

6. The high powered microwave radiation generation device according to claim 1, wherein the transmission line shortens the rise time of the plurality of electrical pulses.

7. The high powered microwave radiation generation device according to claim 1, wherein the transmission line shortens the fall time of the plurality of electrical pulses.

8. A high powered microwave radiation generation device comprising:
   a high voltage pulser comprising a plurality of solid-state switches, the high voltage pulser has a low stray inductance and a low stray capacitance, the high voltage pulser produces a plurality of electrical pulses having a first peak voltage that is greater than 1 kV and a pulse repetition frequency between 10 kHz and 100 kHz;
   a transmission line electrically coupled with the high voltage pulser, the transmission line has a low stray inductance and a low stray capacitance;

a high voltage output electrically coupled with the nonlinear transmission line that radiates microwave radiation at a frequency greater than 100 MHz.

9. The high powered microwave radiation generation device according to claim 8, further comprising:

a pulse recirculating circuit electrically coupled with the transmission line and the high voltage output, the pulse recirculating circuit configured to direct unradiated energy from the high voltage output to the nonlinear transmission line.

10. The high powered microwave radiation generation device according to claim 9, wherein the pulse recirculating circuit comprises at least one diode.

11. The high powered microwave radiation generation device according to claim 9, wherein the pulse recirculating circuit comprises a transmission line.

12. The high powered microwave radiation generation device according to claim 11, wherein the transmission line comprises a delay line that introduces a delay of less than 500 ns in a pulse traveling through the pulse recirculating circuit.

13. The high powered microwave radiation generation device according to claim 9, wherein the transmission line comprises a nonlinear transmission line selected from the group consisting of a gyromagnetic nonlinear transmission line, an LC ladder nonlinear transmission line, a lumped element nonlinear transmission line, a dielectric and/or capacitive lumped element nonlinear transmission line, a parallel plate segmented nonlinear transmission line, a magnetic lumped element nonlinear transmission line.

14. The high powered microwave generation device according to claim 8, wherein the antenna has an impedance less than 0.5 ohms.

15. High powered microwave radiation generation device according to claim 8, wherein the impedance of the transmission line is matched with the impedance of the antenna.

16. The high powered microwave radiation generation device according to claim 8, wherein the transmission line shortens the rise time of the plurality of electrical pulses.

17. The high powered microwave radiation generation device according to claim 8, wherein the transmission line shortens the fall time of the plurality of electrical pulses.

* * * * *